United States Patent [19]

Ueyama et al.

[11] Patent Number: 5,694,051
[45] Date of Patent: Dec. 2, 1997

[54] INSPECTING TRANSISTORS IN AN INVERTER CIRCUIT

[75] Inventors: Atsushi Ueyama; Yoshinari Tsukada; Fumitomo Takano, all of Sayama, Japan

[73] Assignee: Honda Giken Kogyo Kabushiki Kaisha, Toyko, Japan

[21] Appl. No.: 610,754

[22] Filed: Mar. 4, 1996

Related U.S. Application Data

[62] Division of Ser. No. 337,479, Nov. 8, 1994, Pat. No. 5,497,095.

[30] Foreign Application Priority Data

| Nov. 8, 1993 | [JP] | Japan | 5-278241 |
| May 26, 1994 | [JP] | Japan | 6-112748 |
| Sep. 22, 1994 | [JP] | Japan | 6-227965 |

[51] Int. Cl.⁶ .................................................. G01R 31/26
[52] U.S. Cl. .................................................. 324/768; 324/537
[58] Field of Search .................................. 324/500, 537, 324/768, 769, 555

[56] References Cited

U.S. PATENT DOCUMENTS

| 2,872,644 | 2/1959 | Reich | 324/768 |
| 2,953,748 | 9/1960 | Lemson et al. | 324/768 |
| 3,504,285 | 3/1970 | Lemen | 324/768 |
| 3,778,713 | 12/1973 | Jamison | 324/766 |
| 4,243,933 | 1/1981 | Rollman | 324/678 |
| 4,626,952 | 12/1986 | Morikawa | 361/55 |
| 5,386,189 | 1/1995 | Nishimura et al. | 324/158.1 |

FOREIGN PATENT DOCUMENTS

| 2-040572 | 2/1990 | Japan . |
| 3-269268 | 11/1991 | Japan . |
| 5-215800 | 8/1993 | Japan . |

OTHER PUBLICATIONS

Brosch, "Falsch Ist Rasch Gemessen", Elektrotechnik vol. 73, No. 4 Apr. 2, 1991, pp. 62–70.

*Primary Examiner*—Kenneth A. Wieder
*Assistant Examiner*—Glenn W. Brown

[57] ABSTRACT

A method and apparatus for inspecting a transistor in an inverter circuit includes turning on only the transistor of the inverter circuit. A predetermined collector current is supplied to the transistor until a transistor junction temperature reaches a predetermined temperature. The transistor is acceptable if a difference between a transistor collector-to-emitter voltage when the predetermined collector current is supplied and a transistor collector-to-emitter voltage when the junction temperature reaches the predetermined temperature falls within a preset range. Switching elements of the inverter circuit are controlled to supply a current through a resistor to charge an electrolytic capacitor of the inverter circuit. A voltage across the electrolytic capacitor during charging and a time period is measured from the beginning of charging until a time when a voltage across the electrolytic capacitor attains a predetermined voltage. An electrostatic capacitance of the electrolytic capacitor is determined based on the measured time period and a resistance value of the resistor. The electrolytic capacitor is discharged and a discharging voltage and current are measured. An equivalent series resistance of the electrolytic capacitor is determined based upon the voltage of the electrolytic capacitor at the beginning of discharge, the electrolytic capacitance and the measured discharge voltage and current.

10 Claims, 14 Drawing Sheets

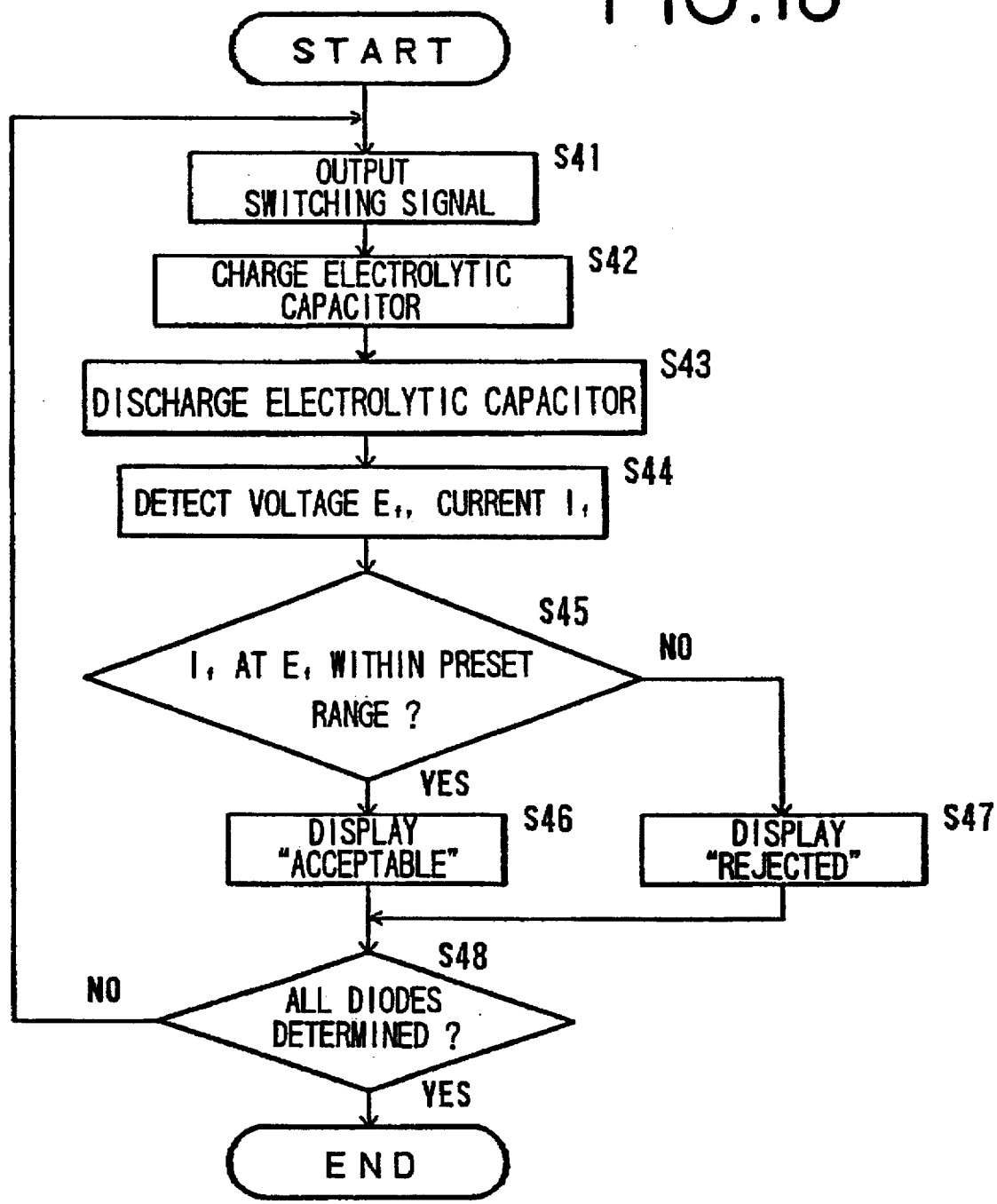

INSPECTING TRANSISTORS IN AN INVERTER CIRCUIT

This application is a divisional of application Ser. No. 08/337,479, filed on Nov. 8, 1994, now U.S. Pat. No. 5,497,095, the entire contents of which are hereby incorporated by reference.

BACKGROUND OF THE INVENTION

1. Field of the Invention

The present invention relates to an apparatus for inspecting an electric component in an inverter circuit, and more particularly to an inspection apparatus for inspecting an electric component in an inverter circuit which converts a direct current into an alternating current while the electric component is being connected in an inverter circuit.

2. Description of the Related Art

Inverters have heretofore been used for turning on and off transistors based on control pulses supplied from a controller to convert a direct current into an alternating current for energizing a load such as a welding machine, an AC motor, or the like.

One typical inverter circuit comprises an electrolytic capacitor for smoothing a voltage, a plurality of transistors, and a plurality of diodes coupled in inverse-parallel connection to the respective transistors. These electric components have to be inspected immediately after they are assembled and subsequently at certain periodic time intervals because of deterioration due to usage. It has been customary to remove each electric component from the inverter circuit and inspect the removed electric component with a dedicated instrument to determine whether the electric component is of acceptable quality or not.

Heretofore, an electrolytic capacitor has been inspected as follows: The electrostatic capacitance and equivalent series resistance of the electrolytic capacitor are measured by an LCR meter, for example, and the electrolytic capacitor is determined as to its quality from the measured electrostatic capacitance and equivalent series resistance. In the inspection process using the LCR meter, a voltage across the electrolytic capacitor is measured while a small alternating current of several mA is passing through the electrolytic capacitor, and the electrostatic capacitance and equivalent series resistance of the electrolytic capacitor are calculated based on the measured voltage. The electrolytic capacitor is determined as to its quality by checking if the calculated electrostatic capacitance and equivalent series resistance fall in respective predetermined ranges or not.

Another inspection process is disclosed in Japanese laid-open patent publication No. 5-215800, for example. In the disclosed inspection process, an electrolytic capacitor to be inspected is charged through a resistor, and a charging time required from the time when the electrolytic capacitor starts being charged until it is charged to a predetermined voltage thereacross is measured. The measured charging time is compared with a reference time which is consumed until a voltage across a normal electrolytic capacitor reaches the predetermined voltage when the normal electrolytic capacitor is charged. If the measured charging time is shorter than the reference time, then the electrolytic capacitor which has been inspected is determined as being deteriorated.

Transistors for use in inverter circuits are required to be checked for saturated voltage vs. emitter current characteristics ($V_{CE}$–$I_C$ characteristics) between the emitter and the collector at both a normal temperature and a predetermined elevated temperature in order to keep reliability of the inverter circuits. To determine whether a transistor of an inverter circuit is acceptable or not, it has been the conventional practice to disconnect the transistor from the inverter circuit, plot the $V_{CE}$–$I_C$ characteristic curve of the transistor with a curve tracer, and check if the plotted $V_{CE}$–$I_C$ characteristic curve falls within a predetermined range from a reference $V_{CE}$–$I_C$ characteristic curve for the transistor. The $V_{CE}$–$I_C$ characteristics are measured when the transistor junction is at a normal temperature, e.g., 25° C., and a predetermined elevated temperature, e.g., 125° C. The inspected transistor is accepted if both the $V_{CE}$–$I_C$ characteristics measured at these temperatures fall within the predetermined range from reference $V_{CE}$–$I_C$ characteristics.

According to the above conventional inspecting process of determining an electrolytic capacitor by calculating the electrostatic capacitance and equivalent series resistance of the electrolytic capacitor which are measured by the LCR meter, the voltage applied to the transistor is low as the current flowing therethrough is small. If an electrolytic capacitor used as a smoothing capacitor in an inverter circuit is inspected, then since conditions in which the electrolytic capacitor is inspected are greatly different from those in which it is actually used and the electrolytic capacitor is not inspected under the conditions in which it is actually used, the result of the inspecting process cannot be used as being obtained under the conditions in which it is actually used. Another problem is that the electrolytic capacitor to be tested has to be removed from the inverter circuit.

The equivalent series resistance of an electrolytic capacitor is considered as being important because it is responsible for the heating of the electrolytic capacitor and hence greatly affects the service life of the electrolytic capacitor. In the inspection procedure in which a measured charging time is compared with a reference time, the equivalent series resistance of an electrolytic capacitor being inspected cannot be measured or calculated as it is only possible in the inspection procedure to determine the electrostatic capacitance of the inspected electrolytic capacitor as being reduced a certain quantity from the electrostatic capacitance of the reference electrolytic capacitor.

The above conventional process for inspecting a transistor is problematic in that a transistor to be inspected has to be disconnected from the inverter circuit in question, and hence the inspecting process is tedious and time-consuming if the inverter circuit is in actual use. The process is time-consuming because the temperature needs to be increased from the normal temperature (25° C.) to the elevated temperature (125° C.). The process requires a dedicated instrument such as a curve tracer or the like, and involves a large number of steps for inspecting transistors on a mass-production line.

As described above, electric components for inverter circuits are individually inspected in the conventional inspecting processes. The conventional inspecting processes require a long period of time until the inspection of an electric component is finished because it is necessary to detach the electric component from the inverter circuit, inspect the electric component, and thereafter connect the electric component that is found acceptable back in the inverter circuit.

SUMMARY OF THE INVENTION

It is therefore an object of the present invention to provide an apparatus for inspecting an electric component in an inverter circuit easily and highly accurately under conditions close to those in which it is actually used, while the electric component is being connected in the inverter circuit.

According to the present invention, the above objects can be achieved by a method of inspecting a transistor in an inverter circuit, while the transistor is being connected in the inverter circuit, including the steps of turning on only the transistor to be inspected which is being connected in the inverter circuit; supplying a predetermined collector current to the transistor from a power supply until a junction temperature of the transistor reaches a predetermined temperature; and determining the transistor as acceptable if a difference between a collector-to-emitter voltage of the transistor when the predetermined collector current is supplied from the power supply to the transistor and a collector-to-emitter voltage of the transistor when the junction temperature of the transistor reaches the predetermined temperature falls within a predetermined range.

The above objects also can be achieved by a method of inspecting an electrolytic capacitor in an inverter circuit including the steps of turning off switching elements included in the inverter circuit and supplying a current from a DC power supply through a resistor to charge the electrolytic capacitor; measuring a voltage across the electrolytic capacitor while the electrolytic capacitor is being charged and a time period from the beginning of charging the electrolytic capacitor until a time at which a voltage across the electrolytic capacitor attains a predetermined voltage; determining an electrostatic capacitance of the electrolytic capacitor based on the measured time period measured and a resistance value of the resistor; discharging the charged electrolytic capacitor; measuring a discharging voltage across the electrolytic capacitor and a discharging current flowing from the electrolytic capacitor while the electrolytic capacitor is being discharged; and determining an equivalent series resistance of the electrolytic capacitor based on the voltage across the electrolytic capacitor at the beginning of discharging the electrolytic capacitor, the determined electrostatic capacitance of the electrolytic capacitor, the determined discharging voltage across the electrolytic capacitor and the determined discharging current flowing from the electrolytic capacitor.

The electric components of the inverter circuit can be inspected while being connected in the inverter circuit, rather than being disconnected from the inverter circuit.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 18 is a flowchart of an operation sequence of the inspecting arrangement shown in FIG. 17 to determine whether the diode is acceptable or not.

DETAILED DESCRIPTION OF THE PREFERRED EMBODIMENTS

Figure 1:
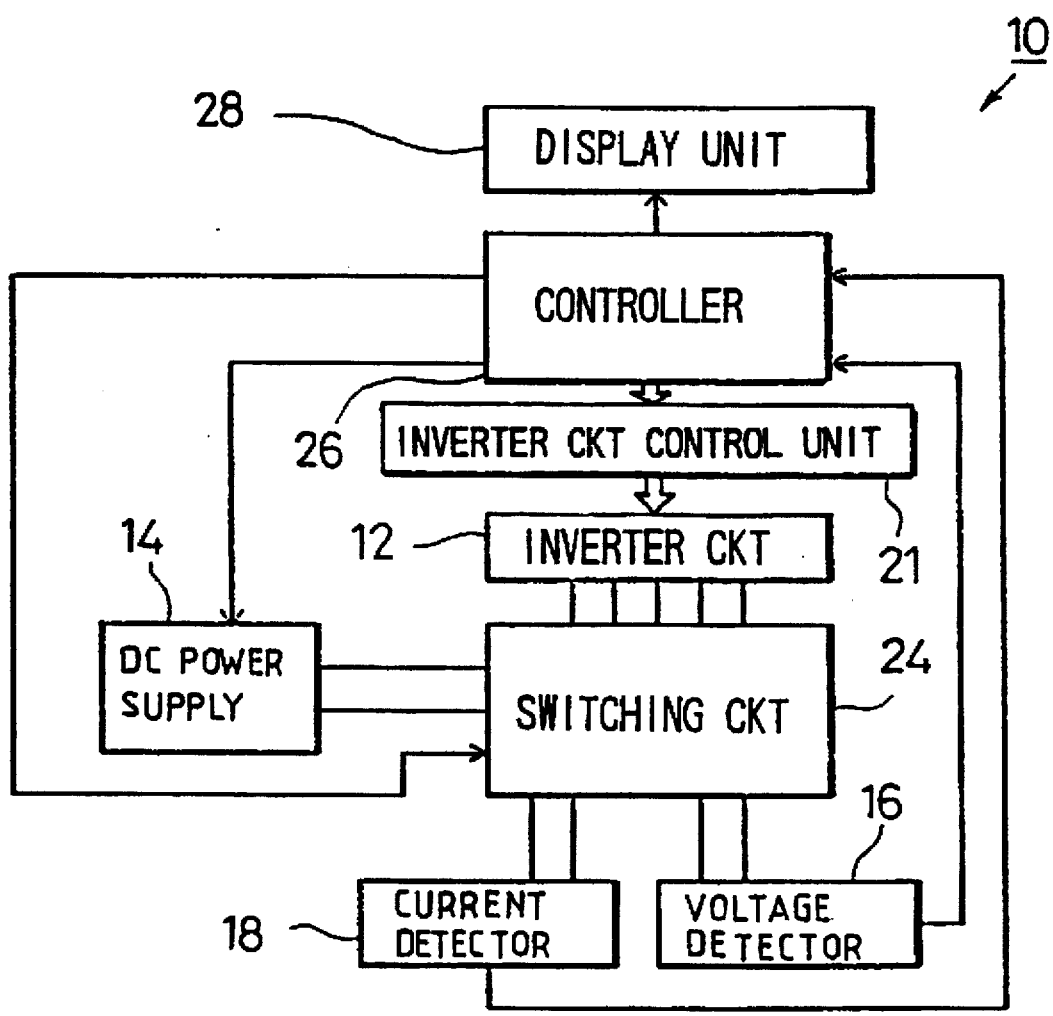
FIG. 1 is a block diagram of an apparatus for inspecting an electric component in an inverter circuit according to the present invention.

FIG. 1 shows in block form an apparatus for inspecting an electric component in an inverter circuit according to the present invention, the inverter circuit being also shown in FIG. 1.

The apparatus, generally designated by the reference numeral 10, has a DC power supply 14 for supplying a direct current to an inverter circuit 12 which is composed of electric components to be inspected, a voltage detector 16 for measuring a voltage at a desired location in the inverter circuit 12, a current detector 18 for detecting a current at a desired location in the inverter circuit 12, and a switching circuit 24 having a matrix of switches or switching contacts for switching between a location to which the direct current is supplied from the DC power supply 14 and locations which are measured by the voltage detector 16 and the current detector 18.

The apparatus 10 also includes a controller 26 for applying drive signals to the inverter circuit 12 through an inverter circuit control unit 21, the DC power supply 14, and the switching circuit 24, reading a voltage outputted from the voltage detector 16 and a current outputted from the current detector 18, and determining whether each of the electric components of the inverter circuit 12 is acceptable or not, and a display unit 28 connected to the controller 26 for displaying information thereon.

Figure 2:
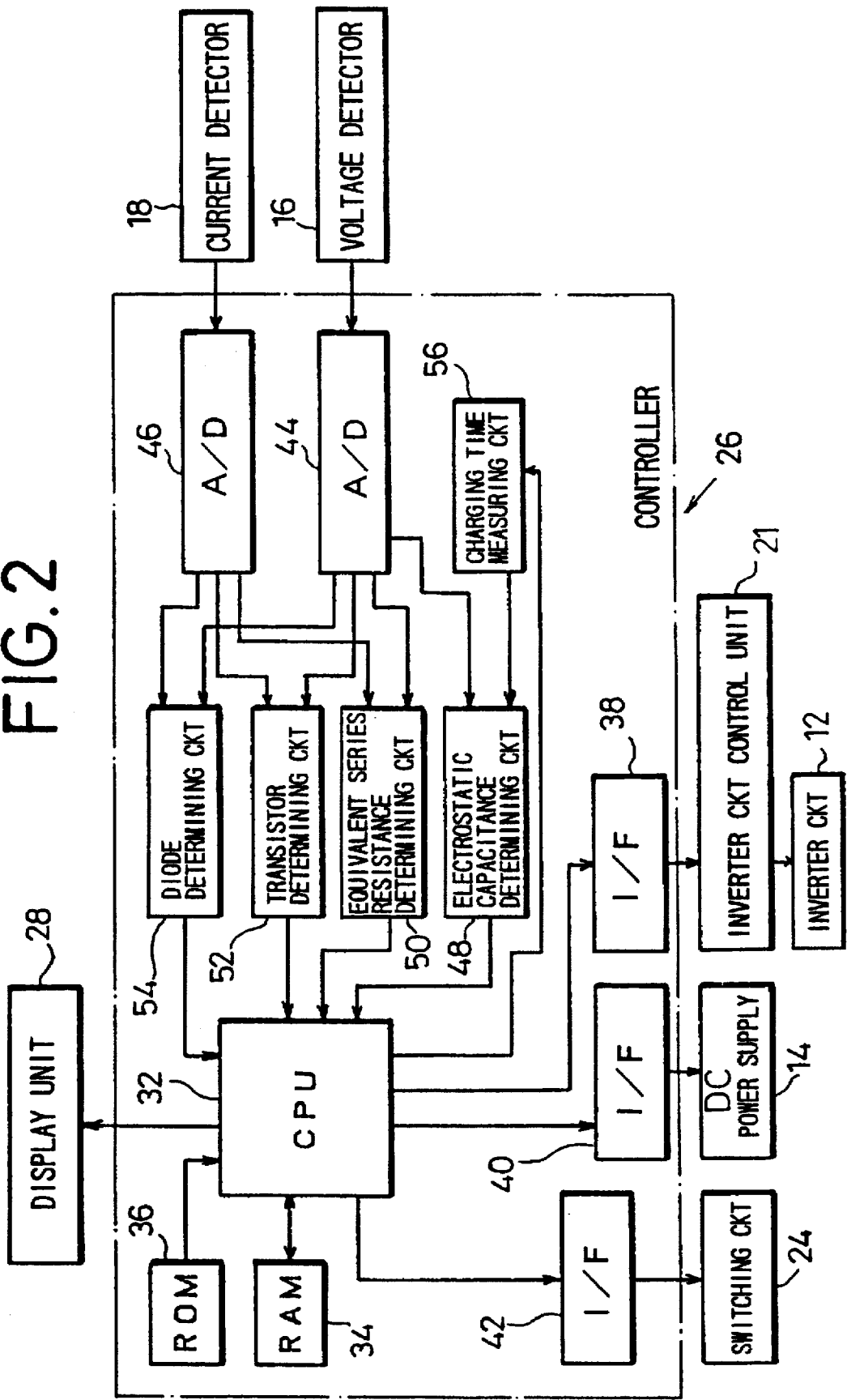
FIG. 2 is a block diagram of a controller in the apparatus shown in FIG. 1.

The controller 26 is shown in block form in FIG. 2.

The controller 26 includes a central processing unit (CPU) 32, a random-access memory (RAM) 34 for temporarily storing results of calculations carried out by the CPU 32, a read-only memory (ROM) 36 for storing a program according to which the controller 26 controls the apparatus 10, an interface (I/F) 38 with the inverter circuit control unit 21, an I/F 40 with the DC power supply 14, and an I/F 42 with the switching circuit 24.

The controller 26 also includes an analog-to-digital (A/D) converter 44 for converting a detected output signal from the voltage detector 16 into a digital signal, an A/D converter 46 for converting a detected output signal from the current detector 18 into a digital signal, an electrostatic capacitance determining circuit 48 for determining whether an electrolytic capacitor connected in the inverter circuit 12 is acceptable or not based on the electrostatic capacitance of the electrolytic capacitor, an equivalent series resistance determining circuit 50 for determining whether an electrolytic capacitor connected in the inverter circuit 12 is acceptable or not based on the equivalent series resistance $R_{ESR}$ of electrolytic capacitor, a transistor determining circuit 52 for determining whether a transistor connected in the inverter circuit 12 is acceptable or not based on the collector current $I_C$ vs. collector-to-emitter voltage $V_{CE}$ characteristic curve ($V_{CE}$–$I_C$ curve) of the transistor, a diode determining circuit 54 for determining whether a diode connected in the inverter circuit 12 is acceptable or not, and a charging time measuring circuit 56 for measuring a charging time in which an electrolytic capacitor is charged.

Figure 3:
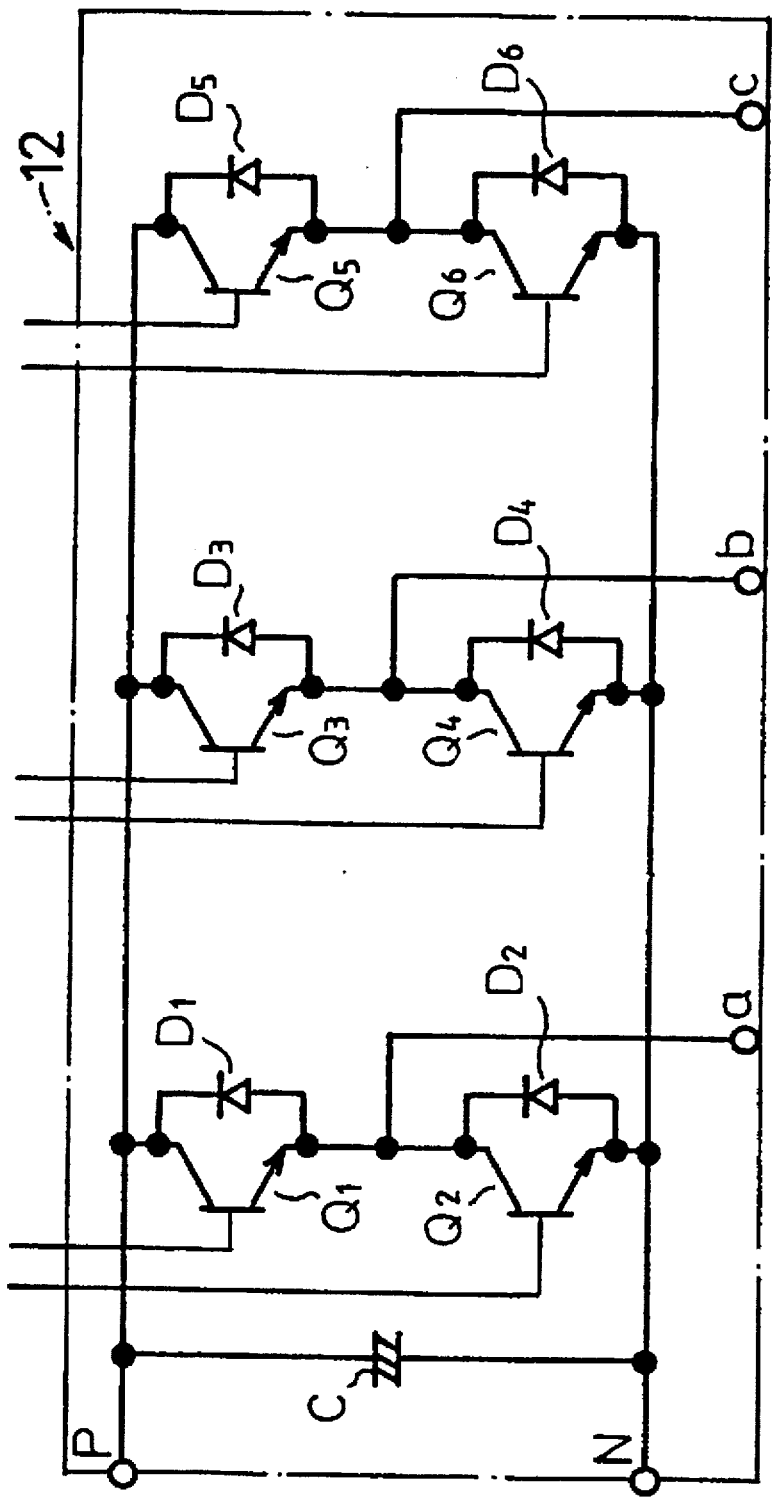
FIG. 3 is a circuit diagram of an inverter circuit composed of electric components that can be tested by the apparatus shown in FIG. 1.

FIG. 3 shows an electric circuit of the inverter circuit 12.

The inverter circuit 12 comprises an electrolytic capacitor C, a plurality of transistors $Q_1$–$Q_6$, and a plurality of diodes $D_1$–$D_6$ connected between the collectors and emitters of the transistors $Q_1$–$Q_6$, respectively.

The electrolytic capacitor C, the transistors $Q_1$–$Q_6$, and the diodes $D_1$–$D_6$ of the inverter circuit 12 are electric components to be inspected by the apparatus 10.

Now, various inspecting arrangements for determining whether these electric components are acceptable or not will be described below.

First, an inspecting arrangement for inspecting electrolytic capacitor C to determine whether it is acceptable or not will be described below.

Figure 4:
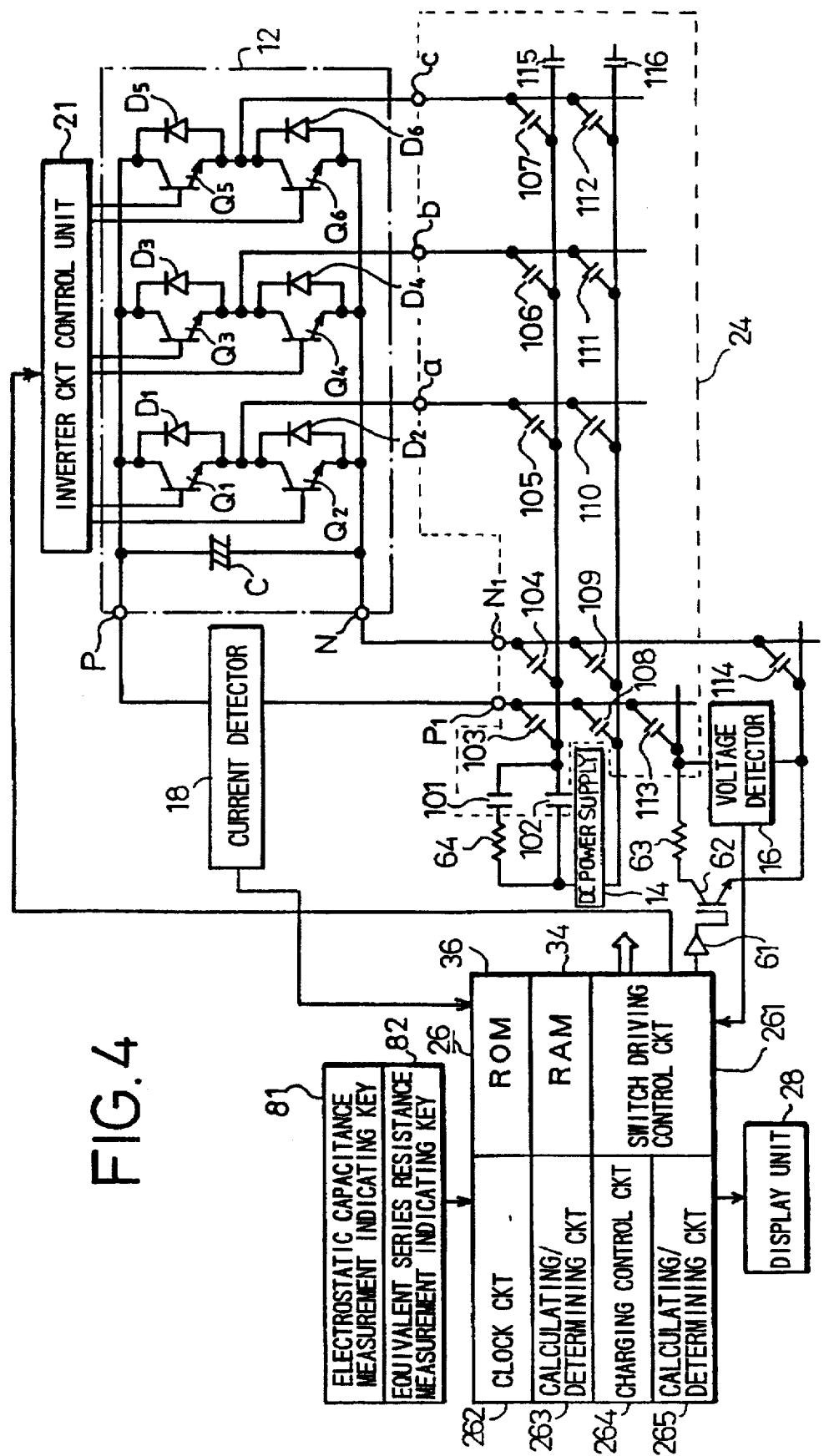
FIG. 4 is a block diagram of an inspecting arrangement in which the apparatus shown in FIG. 1 is employed to determine whether an electrolytic capacitor is acceptable or not.

FIG. 4 shows such an inspecting arrangement in which the apparatus shown in FIG. 1 is employed to determine whether the electrolytic capacitor C is acceptable or not. The inverter circuit 12 is also shown in FIG. 4.

As shown in FIG. 4, an inverter circuit control unit 21 is connected to the inverter circuit 12 for turning on and off the transistors $Q_1$–$Q_6$ at predetermined times when receiving an output signal from the controller 26.

The transistors $Q_1$, $Q_2$ have a common junction "a", the transistors $Q_3$, $Q_4$ have a common junction "b", and the transistors $Q_5$, $Q_6$ have a common junction "c". These common junctions "a", "b", "c" are connected respectively to winding ends of a three-phase AC motor (not shown), for example. The transistors $Q_1$–$Q_6$ are turned on and off by the inverter circuit control unit 21 to convert a DC voltage from the DC power supply 14 into AC voltages to energize the three-phase AC motor.

The controller 26 includes an electrostatic capacitance measurement indicating key 81 and an equivalent series resistance measurement indicating key 82. The switching circuit 24 has a matrix of switches or switching contacts 101–116 controllable by an output signal from the controller 26 for forming charging and discharging paths for supplying a current from the DC power supply 14 directly or through a resistor 64 and the switching circuit 24 to the electrolytic capacitor C to charge the electrolytic capacitor C and also discharging the electrolytic capacitor C through a current limiting resistor 63 and a transistor 62. The apparatus 10 has a driver 61 controlled by an output signal from the controller 26 to energize the transistor 62 to discharge the electrolytic capacitor C.

The resistor 64 has a resistance which is greater than the internal resistance of the DC power supply 14 and the equivalent series resistance of the electrolytic capacitor C. The current detector 18 comprises, for example, a current transformer inserted in a current path for detecting a current flowing through the current path, and a converter for converting an output signal from the current transformer into a signal of a predetermined level. The voltage detector 16 is arranged to detect the voltage across the electrolytic capacitor C, convert the detected voltage into a voltage of a predetermined level, and output the converted voltage.

The controller 26, or more specifically the CPU 32, the electrostatic capacitance determining circuit 48, the equivalent series resistance determining circuit 50, and the charging time measuring circuit 56 jointly function as a switch driving control circuit 261, a clock circuit 262, calculating/determining circuits 263, 265, and a charging control circuit 264.

The switch driving control circuit 261 turns on and off the switching contacts 101–116, controls the driver 61, and turns on and off the transistors $Q_1$–$Q_6$ through the inverter circuit control unit 21.

The clock circuit 262 is responsive to an output signal from the electrostatic capacitance measurement indicating key 81 for operating the switching circuit 24 under the control of the switch driving control circuit 261 to supply a current from the DC power supply 14 through the resistor 64 to the electrolytic capacitor C. The clock circuit 262 also reads a voltage across the electrolytic capacitor C, which is detected by the voltage detector 16, through the A/D converter 44 from the time when the clock circuit 262 has operated the switching circuit 24, and measures time until the voltage across the electrolytic capacitor C reaches 63.21% of an output voltage $E_1$ of the DC power supply 14.

The calculating/determining circuit 263 calculates an electrostatic capacitance $C_T$ of the electrolytic capacitor C from a resistance $R_1$ of the resistor 64 and a charging time τ measured by the clock circuit 262, and determines whether the calculated electrostatic capacitance $C_T$ falls within a predetermined range or not.

The charging control circuit 264 is responsive to an output signal from the equivalent series resistance measurement indicating key for operating the switching circuit 24 under the control of the switch driving control circuit 261 to supply a current from the DC power supply 14 to the electrolytic capacitor C. The charging control circuit 264 keeps the switching circuit 24 in the operated condition until the output voltage from the voltage detector 16 becomes stable, i.e., remains unchanged, from the time when the clock circuit 262 has operated the switching circuit 24.

The calculating/determining circuit 265 controls the switch driving control circuit 261 to cause the driver 61 to turn on the transistor 62 from the time when the charging of the electrolytic capacitor C under the control of the charging control circuit 264 is finished. The calculating/determining circuit 265 also controls the switch driving control circuit 261 to operate the switching circuit 24 to cut off the current from the DC power supply 14 to the electrolytic capacitor C, and then controls the switch driving control circuit 261 to operate the switching circuit 24 to discharge the electrolytic capacitor C. When the discharging of the electrolytic capacitor C is finished, the calculating/determining circuit 265 calculates an equivalent series resistance from the voltage across the electrolytic capacitor C and a discharged current detected by the current detector 18, and determines whether the calculated equivalent series resistance falls within a predetermined range or not.

The display unit 28 displays information indicative of whether the electrolytic capacitor C is acceptable or not based on output signals from the calculating/determining circuits 263, 265.

Figure 5:
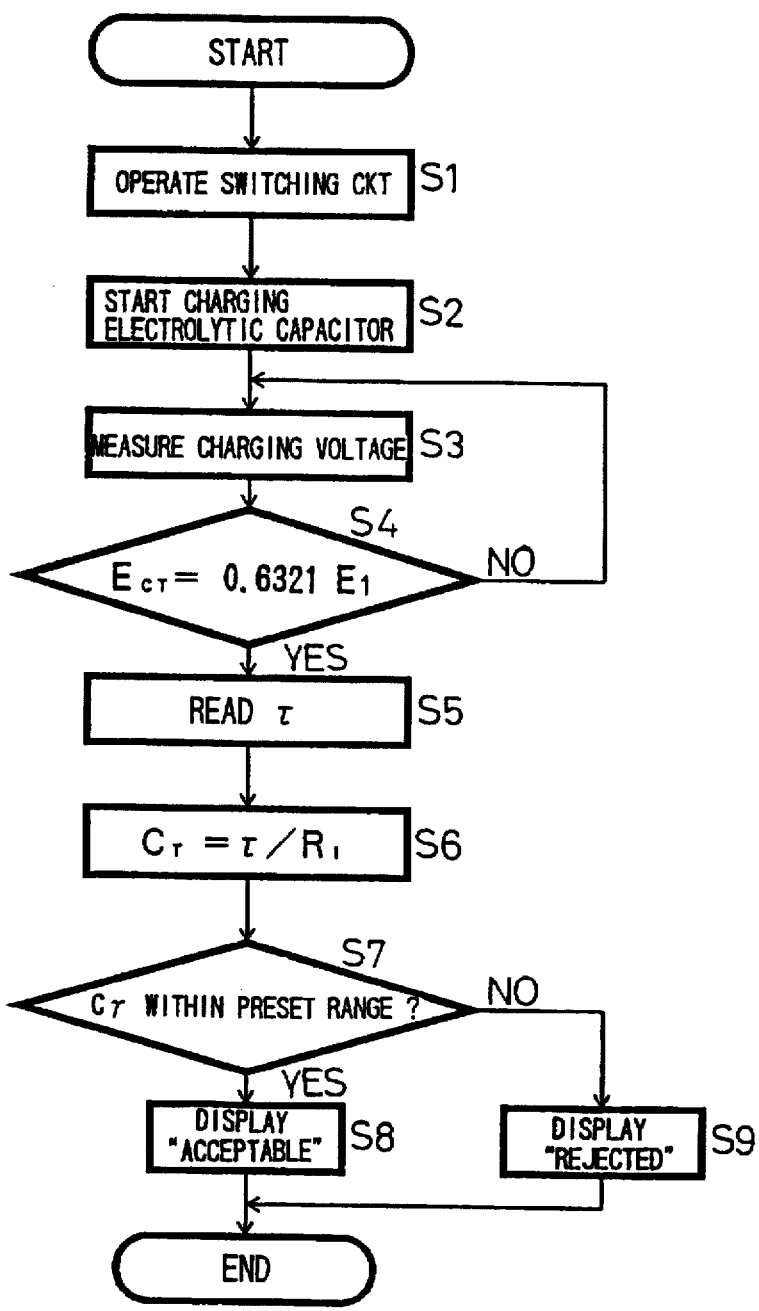
FIG. 5 is a flowchart of an operation sequence of the inspecting arrangement shown in FIG. 4 for calculating an electrostatic capacitance to determine whether the electrolytic capacitor is acceptable or not.

A process of calculating the electrostatic capacitance of the electrolytic capacitor C will be described below with reference to FIG. 5.

Measurement of the electrostatic capacitance of the electrolytic capacitor C is started when the electrostatic capacitance measurement indicating key 81 is pressed. When the electrostatic capacitance measurement indicating key 81 is pressed, the switch driving control circuit 261 produces an output signal to control the inverter circuit control unit 21 to turn off all the transistors $Q_1 \sim Q_6$. The calculating/determining circuit 263 controls the switch driving control circuit 261 to turn on only the switching contacts 101, 103, 109, 113, 114 of the switching circuit 24, for thereby supplying a current from the DC power supply 14 through the resistor 64 to charge the electrolytic capacitor C in a step S1. The electrolytic capacitor C now starts being charged through the resistor 64 in a step S2. When the electrolytic capacitor C starts being charged, the clock circuit 262 starts measuring time, and reads a voltage $E_{CT}$ across the electrolytic capacitor C, which is detected by the voltage detector 16, in a step S3. The output voltage from the voltage detector 16 is representative of the voltage $E_{CT}$ across the electrolytic capacitor C, which progressively increases depending on a time constant based on the resistance $R_1$ of the resistor 64 and the electrostatic capacitance $C_T$ of the electrolytic capacitor C. The electrolytic capacitor C is continuously charged until the voltage $E_{CT}$ across the electrolytic capacitor C, read from the voltage detector 16, reaches $0.6321E_1$ in a step S4.

If the voltage $E_{CT}$ across the electrolytic capacitor C reaches $E_{CT}=0.6321E_1$ in the step S4, then the time which has elapsed from the start of the charging, i.e., the charging time τ, is read in a step S5. Then, the electrostatic capacitance $C_T=\tau/R_1$ is calculated in a step S6.

The step S6 is followed by a step S7 which determines whether the electrostatic capacitance $C_T$ falls within a preset range or not in a step S7. If the electrostatic capacitance $C_T$ falls within the preset range in the step S7, then the display unit 28 displays information indicating that the electrolytic capacitor C is acceptable in a step S8. Conversely, if the electrostatic capacitance $C_T$ does not fall within the preset range in the step S7, then the display unit 28 displays information indicating that the electrolytic capacitor C is rejected in a step S9.

The voltage $E_{CT}$ across the electrolytic capacitor C is generally represented by $E_{CT}=E_1(1-e^{-(1/CR_1)})$ where $\tau=CR_1$. When t=τ, the voltage $E_{CT}$ across the electrolytic capacitor C is $E_{CT}=E_1(1-e^{-1})\approx 0.6321E_1$. Therefore, in the step S6, the electrostatic capacitance can be calculated according to $C_T=\tau/R_1$ from the ratio of the charging time τ until the voltage $E_{CT}$ reaches $E_{CT}\approx 0.6321E_1$ to the resistance $R_1$ of the resistor 64.

By setting the voltage of the DC power supply 14 and the resistance $R_1$ of the resistor 64 as described above, the electrolytic capacitor C can be supplied with a current having a value close to that under actual conditions of use. Therefore, the electrostatic capacitance can be measured and calculated under conditions close to those in which the electrolytic capacitor C is actually used.

A process of calculating the equivalent series resistance of the electrolytic capacitor C will be described below.

Figure 6:
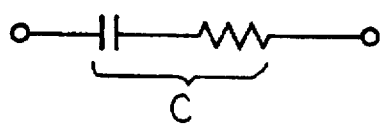
FIG. 6 is an equivalent circuit diagram of an electrolytic capacitor.

As shown in FIG. 6, an equivalent circuit of the electrolytic capacitor C is represented by a series-connected circuit of a capacitor having an electrostatic capacitance $C_T$ and a resistor having a resistance $R_{ESR}$, which is called an equivalent series resistance. When the equivalent series resistance $R_{ESR}$ increases, the temperature of the electrolytic capacitor C rises, affecting the service life thereof, as described above.

Calculations of the equivalent series resistance will be described below with reference to FIG. 7.

Measurement of the equivalent series resistance is started when the equivalent series resistance measurement indicating key 82 is pressed. When the equivalent series resistance measurement indicating key 82 is pressed, the switch driving control circuit 261 produces an output signal to control the inverter circuit control unit 21 to turn off all the transistors $Q_1 \sim Q_6$. The charging control circuit 264 and the switch driving control circuit 261 control the switching circuit 24 to turn on only the switching contacts 101, 103, 109, 113, 114 in a step S11. The electrolytic capacitor C is now charged by a current from the DC power supply 14, and continuously charged until the voltage across the electrolytic capacitor C detected by the voltage detector 16 remains unchanged in a step S12. Since the electrolytic capacitor C is charged until the voltage across the electrolytic capacitor C remains unchanged in the step S12, the electrolytic capacitor C is fully charged at the end of the step S12.

After the step S12, the switch driving control circuit 261 controls the switching circuit 24 to turn on only the switching contacts 113, 114, and the driver 61 turns on the transistor 62 in a step S13. Under this condition, the application of the voltage from the DC power supply 14 to the electrolytic capacitor C is cut off, whereupon the electrolytic capacitor C is discharged through the current limiting resistor 63 and the transistor 62 in a step S14. A discharged current $I_d$ from the electrolytic capacitor C flows through the current limiting resistor 63 and the transistor 62, is detected by the current detector 18, and read through the A/D converter 46. A voltage $V_c$ across the electrolytic capacitor C is detected by the voltage detector 16 in a step S15.

The step S15 is followed by a step S16 in which the calculating/determining circuit 265 calculates an equivalent series resistance $R_{ESR}$ from the discharged current $I_d$ and the voltage $V_C$. The calculation of the equivalent series resistance $R_{ESR}$ will be described later on. After the step S16, the calculating/determining circuit 265 determines whether the discharged current $I_d$ is zero or not in a step S17. The steps S14 through S16 are repeated until the discharged current $I_d$ becomes zero. Then, the calculating/determining circuit 265 determines whether the equivalent series resistance $R_{ESR}$ falls within a preset range or not in a step S18. If the equivalent series resistance $R_{ESR}$ falls within the preset range in the step S18, then the display unit 28 displays information indicating that the electrolytic capacitor C is acceptable in a step S19. Conversely, if the equivalent series resistance $R_{ESR}$ does not fall within the preset range in the step S18, then the display unit 28 displays information indicating that the electrolytic capacitor C is rejected in a step S20.

The calculation of the equivalent series resistance $R_{ESR}$ in the step S16 will be described below.

Figure 8:
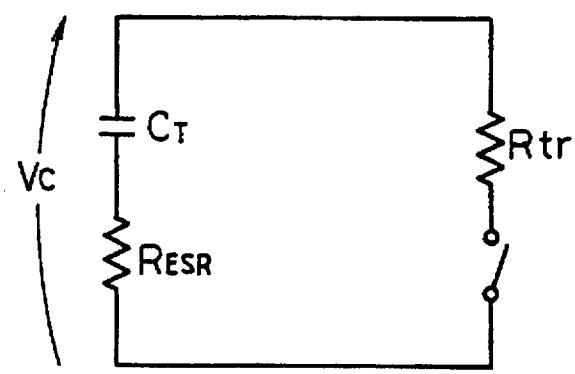
FIG. 8 is an equivalent circuit diagram illustrative of the calculation of the equivalent series resistance of the electrolytic capacitor with the circuit arrangement shown in FIG. 4.

FIG. 8 shows an equivalent circuit of the electrolytic capacitor C while it is being discharged. In FIG. 8, a resistance $R_{tr}$ represents the sum of the resistance of the transistor 62 when it is turned on and the resistance of the current limiting resistor 63. In the following description, $Q_d$ represents a charge remaining in the electrolytic capacitor C while it is being discharged, and $V_{ESR}$ represents a voltage drop across the electrolytic capacitor C due to its equivalent series resistance $R_{ESR}$. When the charging of the electrolytic capacitor C is finished, i.e., immediately before the electrolytic capacitor C starts being discharged, a voltage across the electrolytic capacitor C which is detected by the voltage detector 16 is indicated by $V_{CT}$. At this time, no discharged current $I_d$ flows.

Since the electrostatic capacitance of the electrolytic capacitor C is $C_T$ and the voltage across the electrolytic capacitor C immediately before it starts to be discharged is $V_{CT}$, the charge Q stored in the electrolytic capacitor C immediately before it starts to be discharged is expressed by:

$$Q = C_T V_{CT} \tag{1}$$

Figure 9:
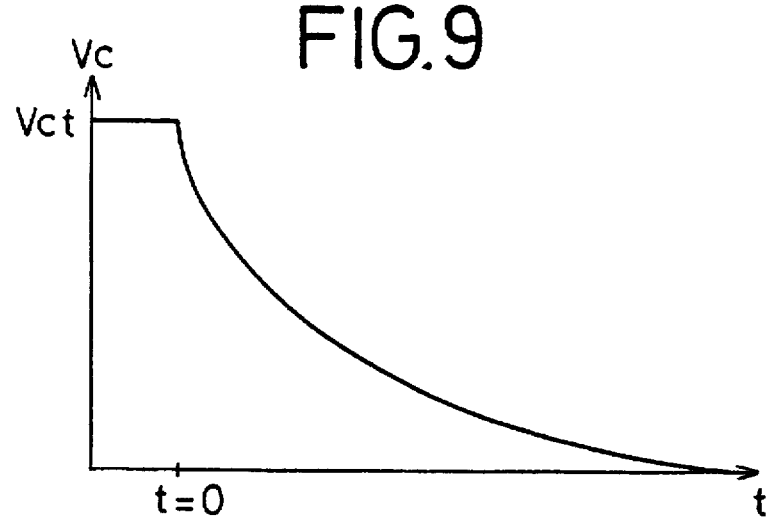
FIG. 9 is a diagram showing how a voltage across the electrolytic capacitor varies at the time of the calculation of the equivalent series resistance of the electrolytic capacitor with the circuit arrangement shown in FIG. 4.
Figure 10:
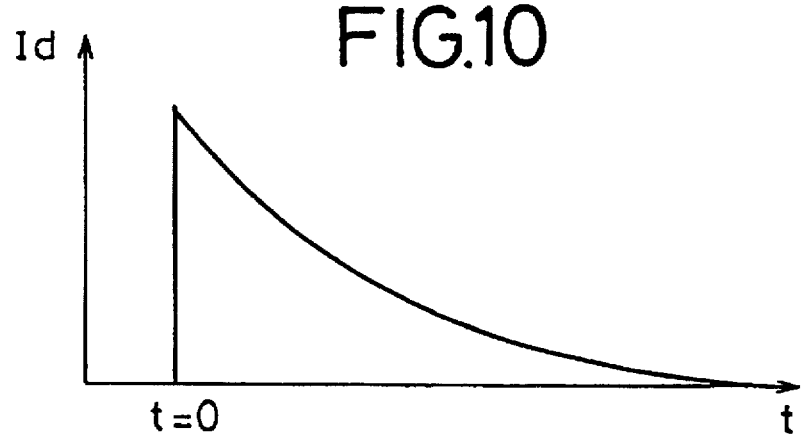
FIG. 10 is a diagram showing how a discharged current from the electrolytic capacitor varies at the time of the calculation of the equivalent series resistance of the electrolytic capacitor with the circuit arrangement shown in FIG. 4.

When the electrolytic capacitor C starts being discharged from a time t=0 (FIG. 9), a voltage $V_C$ across the electrolytic capacitor C which is detected by the voltage detector 16 is progressively lowered as shown in FIG. 9, and the discharged current $I_d$ is also progressively reduced as shown in FIG. 10.

The charge $Q_d$ remaining in the electrolytic capacitor C while it is being discharged is expressed by the following equation (2):

$$Q_d(t) = Q - \int I_d(t) dt \tag{2}$$

By dividing both sides of the equation (2) by the electrostatic capacitance $C_T$, the voltage $V_d$ is obtained according the equation (3) below.

$$\begin{aligned} V_d(t) &= Q_d(t)/C_T \\ &= V_{CT} - (1/C_T) \int I_d(t) dt \end{aligned} \tag{3}$$

The voltage $V_d(t)$ given-according to the equation (3) is a voltage across an ideal electrolytic capacitor C whose equivalent series resistance is zero while it is being discharged.

A voltage $V_C(t)$ across the electrolytic capacitor C which is detected by the voltage detector 16 while the electrolytic capacitor C is being discharged contains a voltage drop developed due to the equivalent series resistance, the voltage drop $V_{ESR}$ developed due to the equivalent series resistance is expressed according to the equation (4) below.

$$V_{ESR}(t) = V_d(t) - V_C(t) \tag{4}$$

Therefore, the equivalent series resistance $R_{ESR}$ is given by the following equation (5):

$$R_{ESR} = V_{ESR}/I_d \tag{5}$$

As can be seen from the above analysis, the calculation indicated by the following equation (6) is carried out in the step S16 to determine the equivalent series resistance $R_{ESR}$:

$$\{V_{CT} - (1/C_T)\int I_d(t) dt - V_C(t)\}/I_d(t) \tag{6}$$

Figure 11:
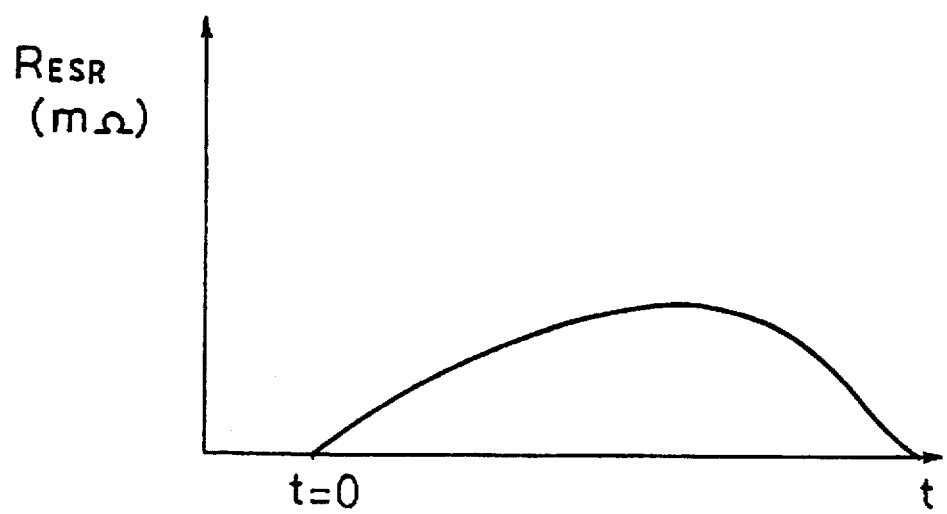
FIG. 11 is a diagram showing how the equivalent series resistance of the electrolytic capacitor varies with respect to time with the circuit arrangement shown in FIG. 4.
Figure 12:
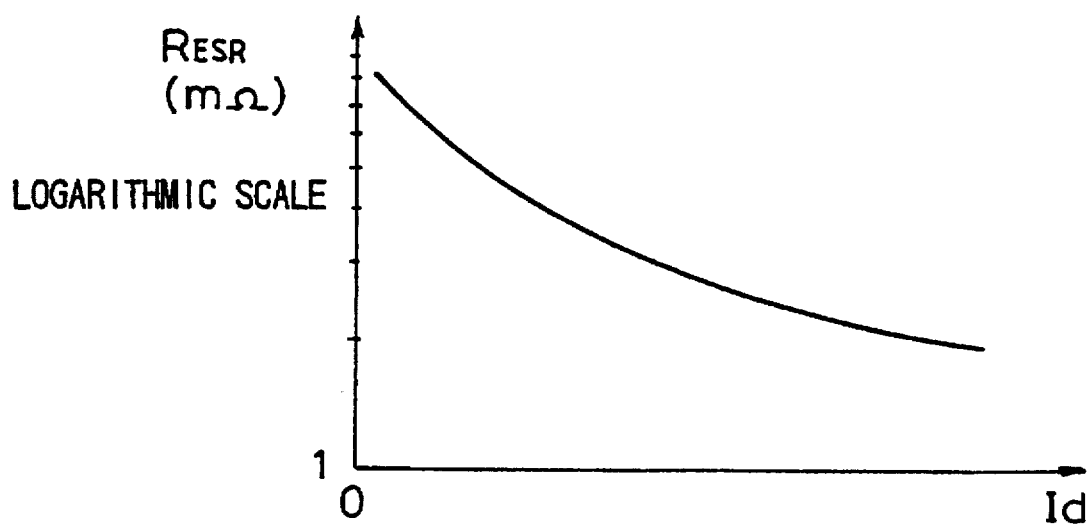
FIG. 12 is a diagram showing how the equivalent series resistance of the electrolytic capacitor varies with respect to the discharge current with the circuit arrangement shown in FIG. 4.

As a result, the equivalent series resistance $R_{ESR}$ with respect to the discharging time is given as shown in FIG. 11, and the equivalent series resistance $R_{ESR}$ with respect to the discharged current is given as shown in FIG. 12.

Figure 13:
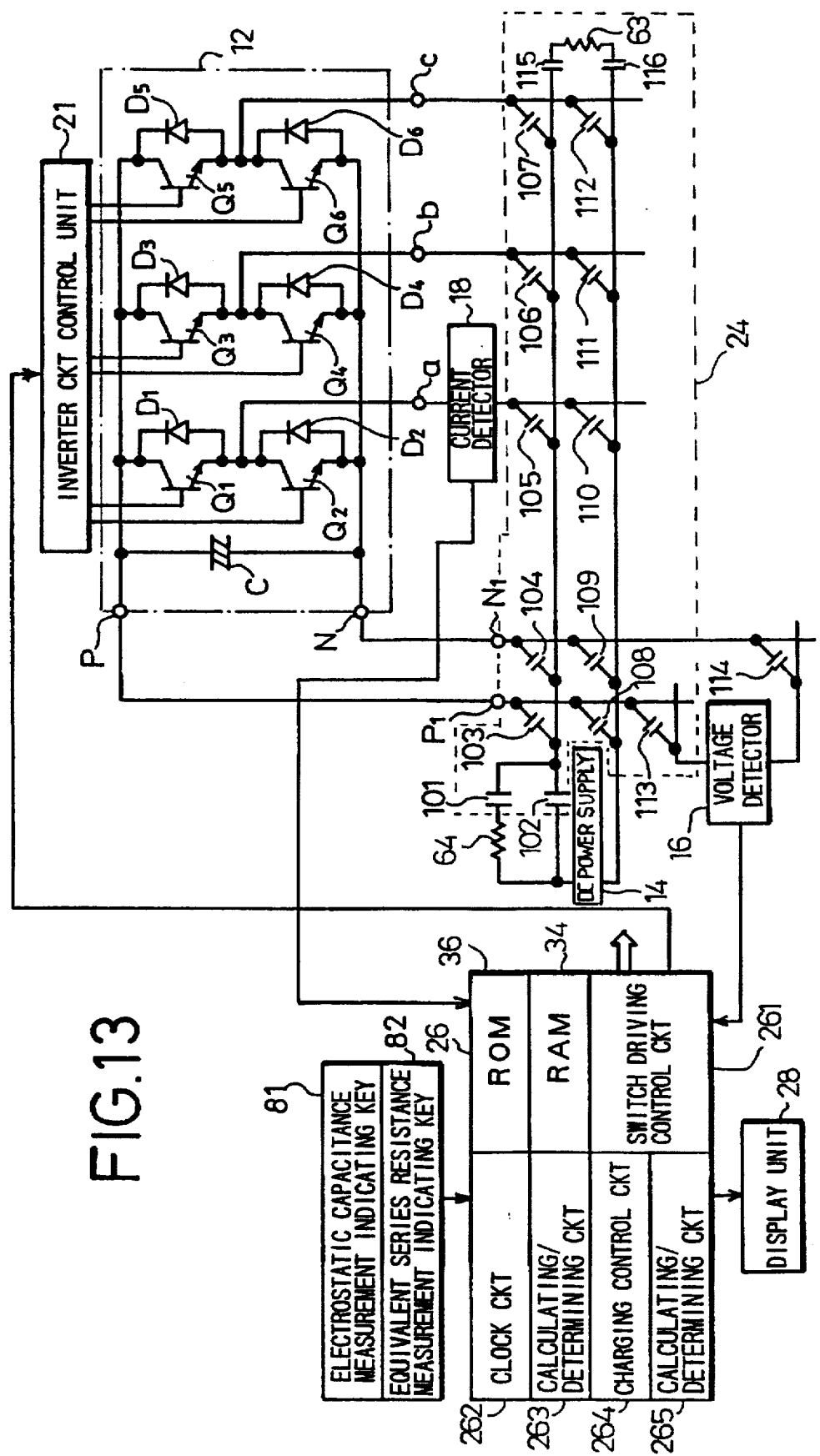
FIG. 13 is a block diagram of another inspecting arrangement in which the apparatus shown in FIG. 1 is employed to determine whether an electrolytic capacitor is acceptable or not.

FIG. 13 is a block diagram of another inspecting arrangement in which the apparatus shown in FIG. 1 is employed to determine whether an electrolytic capacitor is acceptable or not. FIG. 13 also shows an inverter circuit.

The inspecting arrangement shown in FIG. 13 is similar to the inspecting arrangement shown in FIG. 4 except as follows: Part of the transistors $Q_1$–$Q_6$ forms a discharging path for the electrolytic capacitor C. The current limiting resistor 63 is arranged such that it is connected by the switching contacts 115, 116 under the control of the switch driving control circuit 261 when the electrolytic capacitor C is discharged. The electrolytic capacitor C is discharged through the transistors $Q_1$, $Q_4$ rather than the driver 61 and the transistor 62, and a current flowing through the common junction "a" is detected by the current detector 18.

Since the detecting end of the current detector 18 is composed of a current transformer, it is easy to change locations where the current detector 18 is inserted for detecting the current.

A process of calculating and determining the electrostatic capacitance of the electrolytic capacitor C and a process of charging the electrolytic capacitor C in calculating and determining the equivalent series resistance of the electrolytic capacitor C in the inspecting arrangement shown in FIG. 13 are the same as those in the inspecting arrangement shown in FIG. 4, and hence will not be described below.

Figure 7:
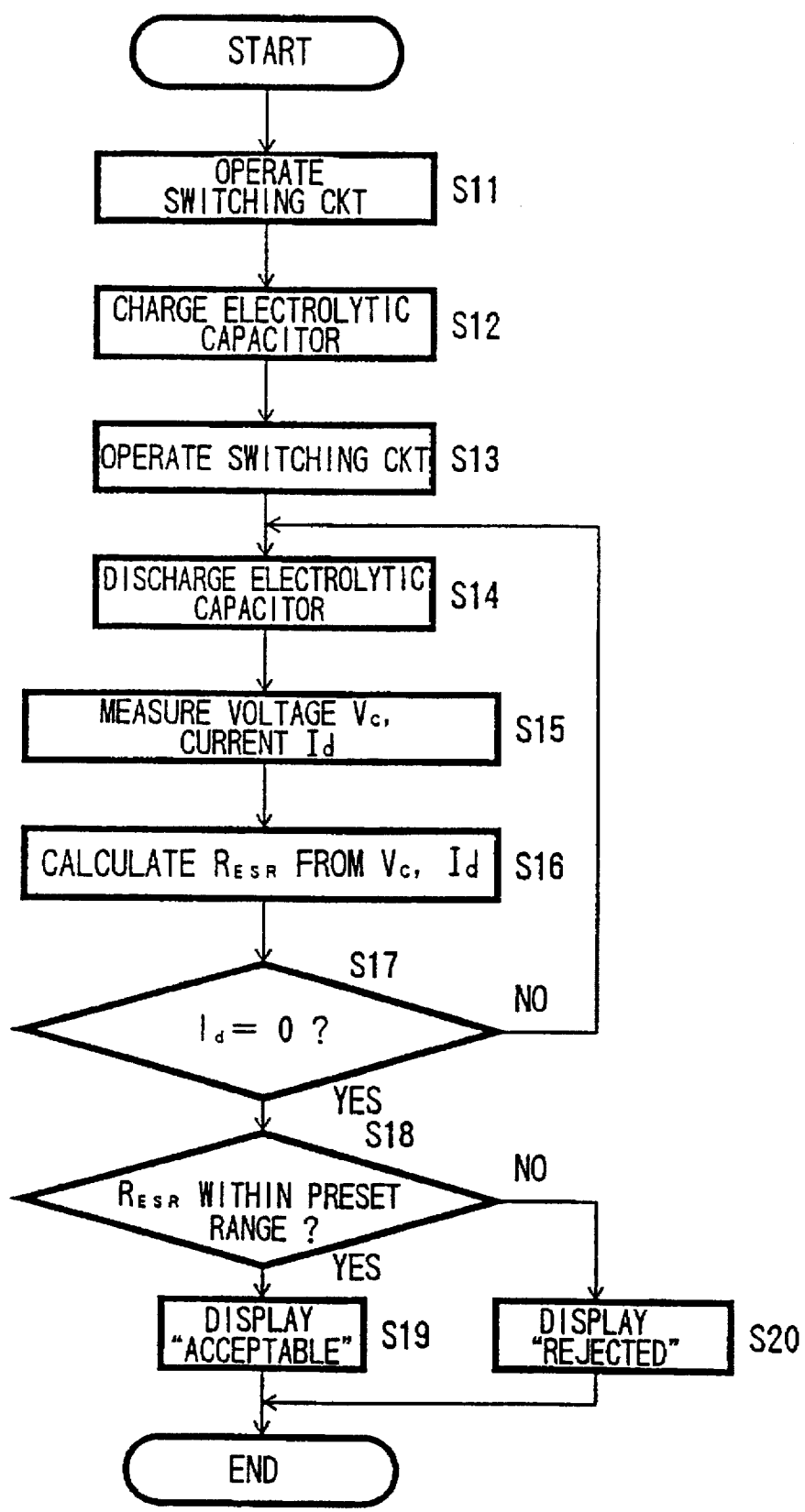
FIG. 7 is a flowchart of an operation sequence for calculating the equivalent series resistance of the electrolytic capacitor to determine whether the electrolytic capacitor is acceptable or not with the circuit arrangement shown in FIG. 4.

In FIG. 13, a process of discharging the electrolytic capacitor C in calculating and determining the equivalent series resistance of the electrolytic capacitor C, i.e., the steps S13 and S14 shown in FIG. 7, is different from that in the inspecting arrangement shown in FIG. 4. The other steps are the same as those shown in FIG. 7. Therefore, the steps S13 and S14 for the inspecting arrangement shown in FIG. 13 will be described below.

Following the step S12, the inverter circuit control unit 21 turns on only the transistor $Q_1$, and the switch driving control circuit 261 turns on only the switching contacts 105, 111, 113, 114, 115, 116.

With these switching contacts turned on, a voltage across the electrolytic capacitor C immediately before it starts being discharged and a voltage across the electrolytic capacitor C while it is being discharged are detected by the voltage detector 16 through the switching contacts 113, 114. By turning on the transistor $Q_4$, the electrolytic capacitor C is discharged through the transistor $Q_1$, the switching contacts 105, 115, the current limiting resistor 63, the switching contacts 116, 111, and the transistor $Q_4$. The discharged current $I_d$ from the electrolytic capacitor C is detected by the current detector 18. Therefore, as with the arrangement shown in FIG. 4, the steps S14 through S16 are repeated until the discharged current $I_d$ becomes zero, for calculating the equivalent series resistance $R_{ESR}$.

Although the transistors $Q_1$, $Q_4$ are turned on in the arrangement shown in FIG. 13, the transistor $Q_4$ may first be turned on and then the transistor $Q_1$ may be turned on to discharge the electrolytic capacitor C, or the transistors $Q_2$, $Q_3$ rather than the transistors $Q_1$, $Q_4$ may be turned on, and the switching contacts 106, 110 rather than the switching contacts 105, 111 may be turned on. Alternatively, the transistors $Q_3$, $Q_6$ may be turned on, or the transistors $Q_5$, $Q_4$ may be turned on.

In the inspecting arrangements shown in FIGS. 4 and 13, the inverter circuit control unit 21 is controlled by the output signal from the switch driving control circuit 261 to control the turning-on and -off of the transistors $Q_1$ through $Q_6$ for inspecting the electrolytic capacitor C. However, the turning-on and -off of the transistors $Q_1$ through $Q_6$ may be controlled directly by the output signal from the switch driving control circuit 261 for inspecting the electrolytic capacitor C.

As described above, in determining whether the electrolytic capacitor is acceptable or not, the electrolytic capacitor can be charged under conditions close to those in which it is actually used by selecting the voltage of the DC power supply and the resistance of the resistor, and hence the electrostatic capacitance of the electrolytic capacitor can be calculated under conditions close to those in which it is actually used. The voltage across the electrolytic capacitor can easily be measured, and only the measurement of the voltage across the electrolytic capacitor and the charging time is sufficient for the calculation of the electrostatic capacitance. The electrolytic capacitor can be inspected easily with high accuracy while it is being connected in the inverter circuit.

While the charged electrolytic capacitor is being discharged, the voltage across the electrolytic capacitor is measured, and the discharged current from the electrolytic capacitor is also measured. The equivalent series resistance of the electrolytic capacitor is calculated based on the voltage across the electrolytic capacitor at the time it starts being discharged, the calculated electrostatic capacitance, the measured discharged current, and the measured voltage across the electrolytic capacitor. The electrolytic capacitor can thus be inspected based on both the electrostatic capacitance and the equivalent series resistance.

For calculating the equivalent series resistance, the electrolytic capacitor is charged until the voltage thereacross remains unchanged. Consequently, the electrolytic capacitor is discharged from the fully charged condition, allowing various data to be measured and calculated highly accurately.

The equivalent series resistance is obtained under conditions close to those in which the electrolytic capacitor is actually used because the equivalent series resistance is calculated with the electrolytic capacitor charged under conditions close to those in which it is actually used.

The equivalent series resistance can be calculated by measuring the voltage across the electrolytic capacitor while it is being discharged and the discharged current from the electrolytic capacitor. Since the voltage across the electrolytic capacitor and the discharged current therefrom can easily be measured, the electrolytic capacitor can be inspected easily with high accuracy while it is being connected in the inverter circuit.

The discharged current is not excessive as the electrolytic capacitor is discharged through the current limiting resistor.

The discharge current is measured by the current detector which includes a current transformer at the detecting end. Accordingly, the measuring point can easily be moved, and the inverter circuit does not need to be disconnected.

Figure 14:
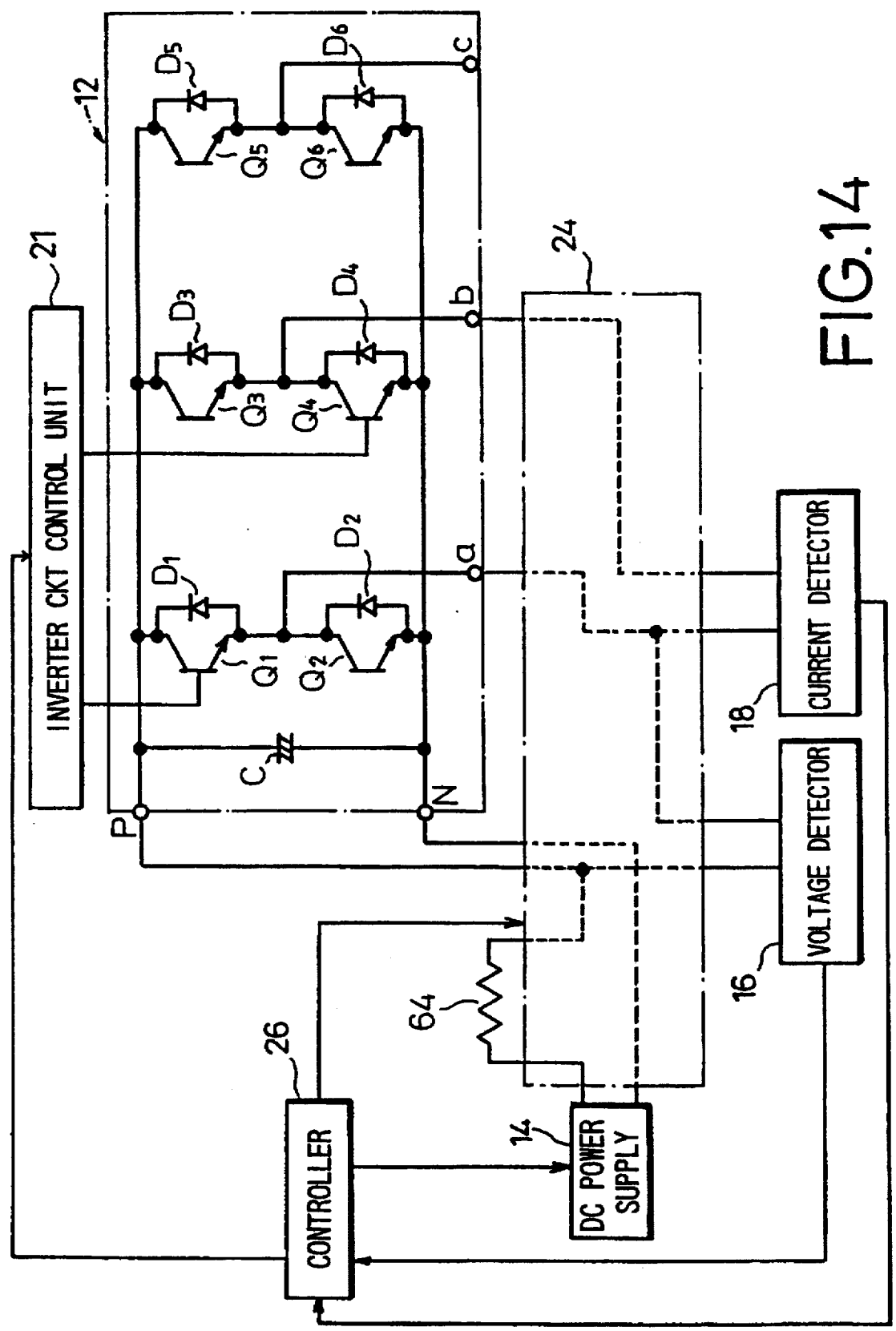
FIG. 14 is a block diagram of a inspecting arrangement in which the apparatus shown in FIG. 1 is employed to determine whether a transistor is acceptable or not.

FIG. 14 shows in block form a inspecting arrangement in which the apparatus shown in FIG. 1 is employed to determine whether a transistor is acceptable or not, FIG. 14 also showing an inverter circuit.

A process of determining whether transistors $Q_1$ through $Q_6$ of an inverter circuit 12 are acceptable or not by measuring $V_{CE}$–$I_C$ curves of the transistors $Q_1$ through $Q_6$ will be described below.

Figure 15:
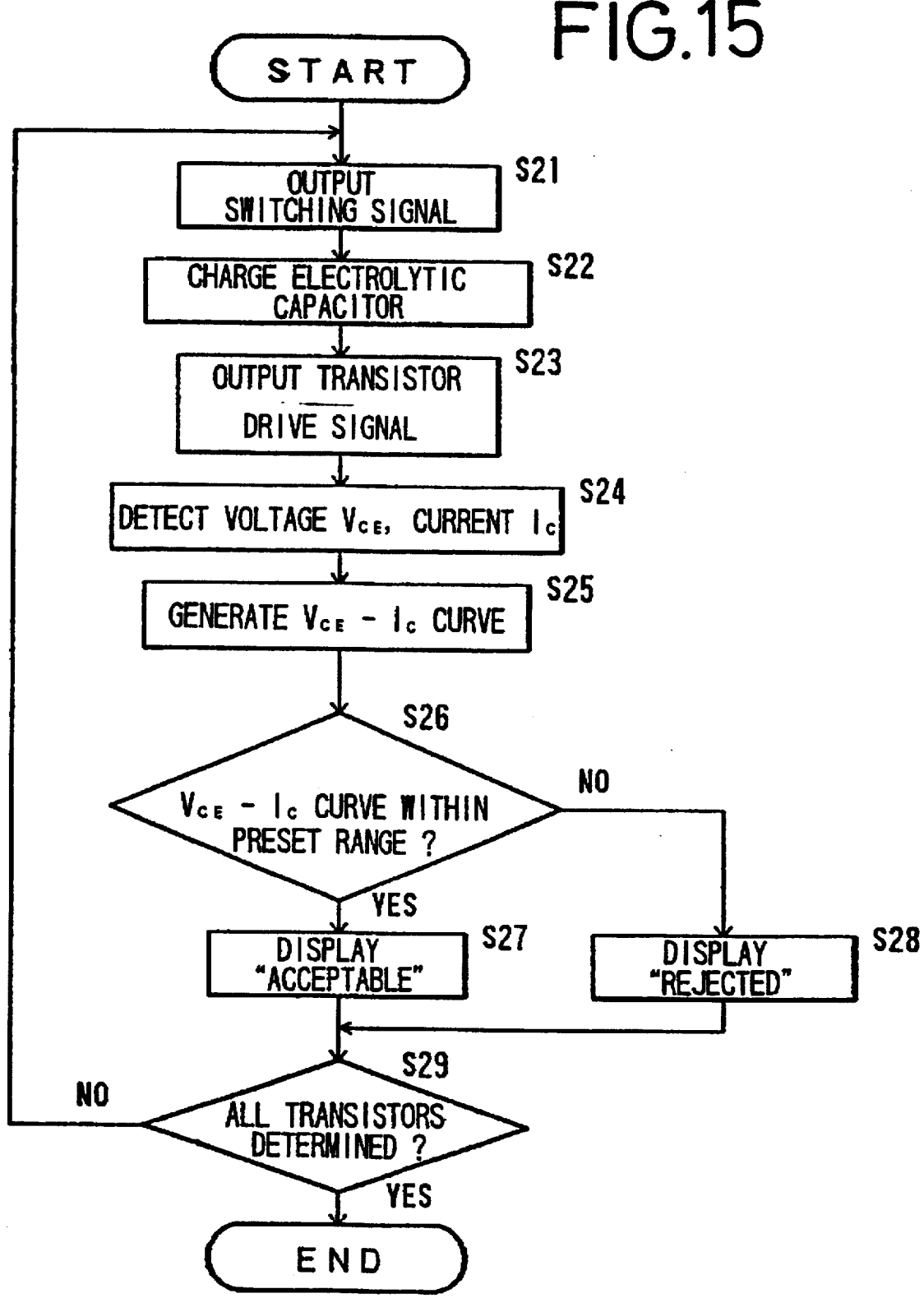
FIG. 15 is a flowchart of an operation sequence of the inspecting arrangement shown in FIG. 14 to determine whether the transistor is acceptable or not.

FIG. 15 shows an operation sequence of the inspecting arrangement shown in FIG. 14 to determine whether the transistors $Q_1$ through $Q_6$ are acceptable or not by measuring the $V_{CE}$–$I_C$ curves thereof.

In FIG. 14, a switching circuit 24 has the same switching contacts as those of FIG. 4, and hence those switching contacts are omitted from illustration. A DC power supply 14, a voltage detector 16, a current detector 18, and a controller 26 are identical to those shown in FIG. 2.

In response to a command for determining whether the transistors $Q_1$ through $Q_6$ are acceptable or not, the CPU 32 controls the switching circuit 24 through the I/F 42 to charge the electrolytic capacitor C with a current from the DC power supply 14 for a predetermined period. After elapse of the predetermined period, the charging of the electrolytic capacitor C is stopped, and the CPU 32 outputs a switching signal to the switching circuit 24 to apply the voltage from the charged electrolytic capacitor C between the collector and emitter of a transistor to be inspected in a step S21. Based on the applied switching signal, the switching contacts of the switching circuit 24 are operated to connect a positive (+) terminal of the DC power supply 14 through the resistor 64 to a terminal P of the inverter circuit 12, connect the voltage detector 16 between the collector and emitter of the transistor $Q_1$, and connect the current detector 18 to detect a collector current $I_C$ from the transistor $Q_1$.

Then, the CPU 32 outputs an energization start signal to the DC power supply 14 to supply a charging current from the DC power supply 14 through the resistor 64 to charge the electrolytic capacitor C of the inverter circuit 12 for a predetermined period in a step S22. When receiving the output signal from the controller 26, the invertor circuit control unit 21 applies a drive signal to the bases of transistors $Q_1$, $Q_4$, for example, of the inverter circuit 12 to render conductive the transistors $Q_1$, $Q_4$ between their collector and emitter in a step S23. The charged electrolytic capacitor C is now discharged through the transistors $Q_1$, $Q_4$.

The voltage detector 16 detects a collector-to-emitter voltage $V_{CE}$ of the transistor $Q_1$, and the collector-to-emitter voltage $V_{CE}$ is converted by the A/D converter 44 (see FIG. 2) into a digital value which is supplied to the transistor determining circuit 52. The current detector 18 detects a collector current $I_C$ from the transistor $Q_1$, and the collector current $I_C$ is converted by the A/D converter 46 into a digital value which is also supplied to the transistor determining circuit 52 in a step S24.

The collector-to-emitter voltage $V_{CE}$ and the collector current $I_C$ vary as the electrolytic capacitor C is discharged. The collector-to-emitter voltage $V_{CE}$ and the collector current $I_C$ are measured at certain intervals of time while they are varying.

The transistor determining circuit 52 generates a $V_{CE}$–$I_C$ curve from the collector-to-emitter voltage $V_{CE}$ and the collector current $I_C$ that are measured in a step S25, and determines whether the generated $V_{CE}$–$I_C$ curve falls in a preset range having a predetermined width which is stored in the transistor determining circuit 52 in a step S26. The result of determination is supplied to the CPU 32.

If the $V_{CE}$–$I_C$ curve falls within the preset range, then the CPU 32 outputs a signal to control the display unit 28 to display information indicating that the transistor $Q_1$ is acceptable in a step S27. If the $V_{CE}$–$I_C$ curve does not fall within the preset range, then the CPU 32 outputs a signal to control the display unit 28 to display information indicating that the transistor $Q_1$ is rejected in a step S28.

The steps S21 through S28 are repeated until the $V_{CE}$–$I_C$ curves of all the transistors $Q_1$ through $Q_6$ are determined in a step S29.

Another embodiment of a process of determining whether a transistor is acceptable or not will be described below.

The CPU 32 outputs a switching signal through the I/F 42 to the switching circuit 24 to operate the switching contacts of the switching circuit 24. The positive (+) terminal of the DC power supply 14 is connected directly to the terminal P of the inverter circuit 12, the voltage detector 16 is connected between the collector and emitter of the transistor $Q_1$, the current detector 18 is connected to detect a collector current $I_C$ from the transistor $Q_1$. In this embodiment, the common junction "a" is connected to a negative (−) terminal of the DC power supply 14 to allow the current detector 18 to detect the collector current $I_C$ from the transistor $Q_1$.

Then, the invertor circuit control unit 21 applies a drive signal, due to the output signal from the controller 26, to the base of transistor $Q_1$ of the inverter circuit 12 to render conductive the transistor $Q_1$ between the collector and emitter thereof. A current supplied from the DC power supply 14 passes only through the transistor $Q_1$ based on an energization start signal outputted from the CPU 32 to the DC power supply 14.

The junction temperature of the transistor $Q_1$ reaches TJ(0) of 25° C., for example, when the current supplied from the DC power supply 14 to the transistor $Q_1$ reaches $I_C$ after it has started being supplied. The DC power supply 14 is controlled such that after the supplied current measured by the current detector 18 has reached $I_C$, the current supplied from the DC power supply 14 is cut off when the junction temperature of the transistor $Q_1$ reaches Ti(t) of 125° C., for example.

Figure 16A:
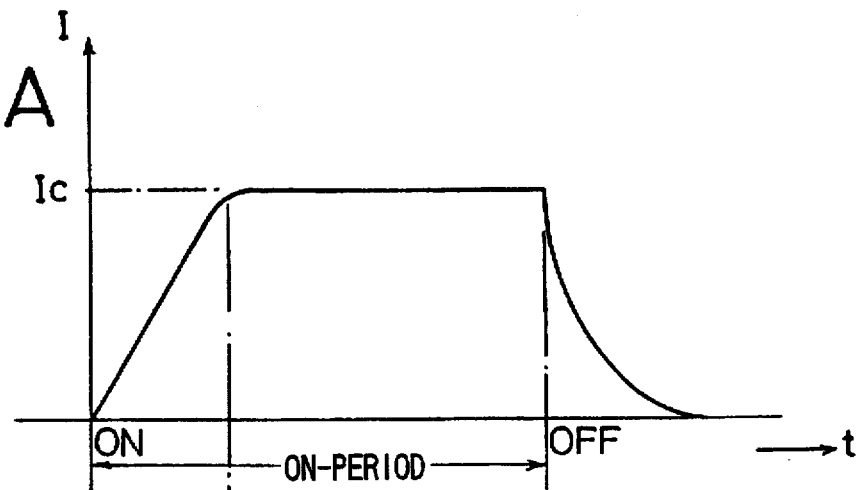
FIG. 16A is a diagram showing the waveform of a collector current in the operation sequence of the inspecting arrangement shown in FIG. 14 to determine whether the transistor is acceptable or not.

When the current starts being supplied from the DC power supply 14 to the transistor $Q_1$, the current flowing through the collector of the transistor $Q_1$ progressively increases, and is then maintained at the value $I_C$. The current $I_C$, which is measured by the current detector 18, flows from the collector to the emitter of the transistor $Q_1$. The collector current has a waveform as shown in FIG. 16A. In FIG. 16A, the vertical axis represents the current detected by the current detector 18, and the horizontal axis represents the time measured from the instant the current starts being supplied from the DC power supply 14. An emitter-to-collector saturated voltage $V_{CE}$ (sat) of the transistor $Q_1$ at the time the current measured by the current detector 18 reaches the value $I_C$ is measured by the voltage detector 16. The emitter-to-collector saturated voltage $V_{CE}$ (sat) will hereinafter be referred to as an emitter-to-collector voltage $V_{CE}$ or simply a voltage $V_{CE}$, whose waveform is shown in FIG. 16B.

When the collector current reaches the value $I_C$ due to the current supplied from the DC power supply 14, the junction temperature of the transistor $Q_1$ is still TJ(0) of 25° C., for example. The voltage measured by the voltage detector 16 at the time the collector current reaches the value $I_C$ is read. The voltage measured at this time is represented by $V_{CE}(0)$.

Upon elapse of a predetermined period after the collector current has reached the value $I_C$, i.e., upon elapse of a period of time until the junction temperature of the transistor $Q_1$ reaches Tj(t) of 125° C., for example, the current supplied from the DC power supply 14 is cut off. As a result, the current flowing from the DC power supply 14 to the collector of the transistor $Q_1$ is cut off. The voltage measured by the voltage detector at the time when the current supplied from the DC power supply 14 is cut off is read, the measured voltage being represented by $V_{CE}(t)$. The voltage $V_{CE}$ of the transistor $Q_1$ after the current has started to be supplied from the DC power supply 14 until the current supplied from the DC power supply 14 is cut off has a waveform as shown in FIG. 16B.

Figure 16B:
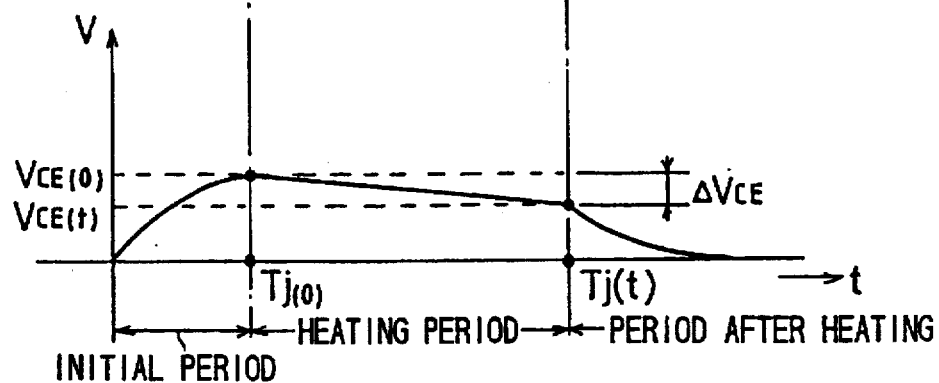
FIG. 16B is a diagram showing a change in a collector-to-emitter voltage in the operation sequence of the inspecting arrangement shown in FIG. 14 to determine whether the transistor is acceptable or not.
Figure 16C:
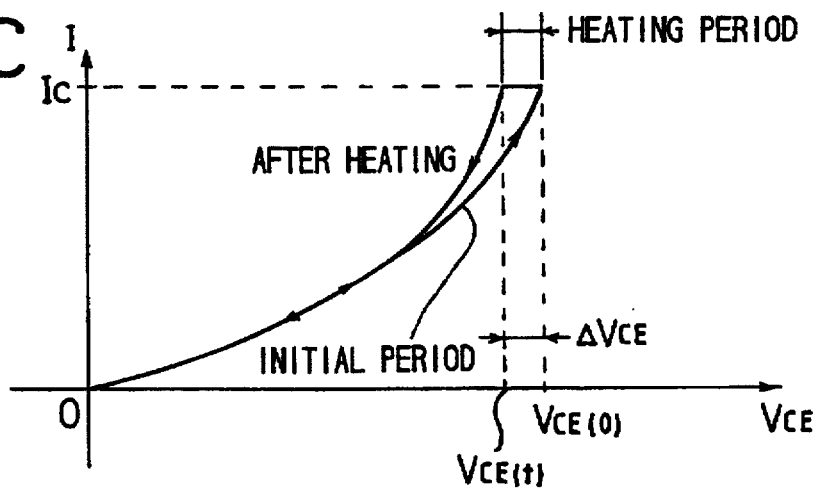
FIG. 16C is a diagram showing the relationship between the collector current and the collector-to-emitter voltage in the operation sequence of the inspecting arrangement shown in FIG. 14 to determine whether the transistor is acceptable or not.

The period of time consumed from the time when the current has started to be supplied from the DC power supply 14 until the collector current reaches the value $I_C$ is equal to a period of time until the junction temperature of the transistor $Q_1$ reaches TJ(0) of 25° C., for example, and is indicated as an initial period in FIG. 16B. The period of time consumed from the time when the collector current has reached the value $I_C$ until the current supplied from the DC power supply 14 is cut off, i.e., the period of time in which the collector current is maintained at the value $I_C$, is equal to a period of time required for the junction temperature of the transistor $Q_1$ to reach Tj(t) of 125° C., for example, from TJ(0) of 25° C., for example, and is indicated as a heating period in FIG. 16B. In the heating period, the junction temperature of the transistor $Q_1$ increases with the supplied current. The relationship shown in FIG. 16B may be represented by the relationship between the voltage $V_{CE}$ and the collector current as shown in FIG. 16C. In FIG. 16C, the collector current increases from the initial period up to the value $I_C$, and is maintained at the value $I_C$ during the heating period until the heating period ends. If the difference between the voltage $V_{CE}(0)$ at the time the collector current reaches the value $I_C$ and the voltage $V_{CE}(t)$ at the time the current supplied from the DC power supply 14 is cut off, i.e., the voltage $V_{CE}(t)$ at the time the junction temperature of the transistor $Q_1$ reaches Tj(t) of 125° C., for example, is represented by $\Delta V_{CE}$, then the transistor $Q_1$ is determined as normal when the $\Delta V_{CE}\{=V_{CE}(0)-V_{CE}(t)\}$ falls within a predetermined range.

Generally, the thermal resistance Zth(t) of a diode is given by the manufacturer of the diode, and is defined according to the equation (7) given below.

$$Zth(t) = \frac{[Tjd(t) - Tjd(0)] - Tad}{P} \qquad (7)$$
$$= \frac{\Delta Tjd(t) - Tad}{P}$$

where P is the electric energy consumed by the diode, and Tjd(0), Tjd(t), Tad are the junction temperature (°K) at the time the supplied current reaches a predetermined value after it has started being supplied, the junction temperature (°K) at the time the predetermined current is continuously supplied for a predetermined period, and the ambient temperature (°K) of the diode, respectively.

From the equation (7) can be determined the electric energy P that is to be consumed by the diode to reach the junction temperature Tjd(t). An electric energy required to reach a target junction temperature can thus be determined. In the above example, a period of time in which to supply the current to reach the target junction temperature of 125° C. can be determined.

The junction temperature Tjd and a forward voltage Vf are related to each other as follows:

$$Vf = \frac{nk\,Tjd}{q}\log\frac{If}{Is} \qquad (8)$$

$$= Tjd \cdot \frac{nk}{q}\log\frac{If}{Is}$$

where n is the emission coefficient, k is the Boltzmann's constant, q is the electric charge of an electron, If is the forward current, and Is is the saturated current.

Therefore, if forward voltages at the time the junction temperature is Tjd(t) and Tjd(0), respectively, are indicated by Vf(t) and Tv(0), respectively, then the difference ΔVf= {Vf(t)−Vf(0)} therebetween is expressed as follows:

$$Vf(t) - Vf(0) = (Tjd(t) - Tjd(0))\frac{nk}{q}\log\frac{If}{Is} \qquad (9)$$

$$= \Delta Vf$$

It is known that the quality of a diode can be determined from ΔVf with respect to Tjd(t) and Tjd(0). Specifically, the diode is determined as acceptable if Dvf falls in a predetermined range.

It is known that a forward voltage drop correlated to the junction temperature can also be utilized for the determination of a transistor as well as a diode. A current $I_C$ from the DC power supply 14 can be set, and a time at which the current supplied from the DC power supply 14 is to be cut off, i.e., a period of time for which the current $I_C$ is to be maintained, can also be set. It is also known that the quality of a transistor can be evaluated using $\Delta V_{CE}$ in the same manner as a diode. Therefore, when $\Delta V_{CE}$ falls within a predetermined range, then the transistor $Q_1$ is determined as acceptable, and $\Delta V_{CE}$ does not fall within a predetermined range, then the transistor $Q_1$ is determined as rejected.

When a single transistor was measured by a curve tracer, the characteristic curve with respect to $\Delta V_{CE}\{=V_{CE}(t)-V_{CE}(0)\}$ and $I_C$ at the time a current which is of the same waveform and value as FIG. 16A was supplied was identical to that shown in FIG. 16C. Acceptable transistors have $\Delta V_{CE}$ falling in a predetermined range, and rejected transistors have $\Delta V_{CE}$ falling outside of the predetermined range. This supports the above statement that a forward voltage drop correlated to the junction temperature can also be utilized for the determination of a transistor.

The period of time required to determine the transistor $Q_1$ in the above fashion is short because the transistor $Q_1$ can be determined while it is being connected in the inverter circuit.

In the above embodiment, the junction temperature Tj(0) is described as being 25° C. However, it may be an ambient temperature at the time of inspection. In this case, a current $I_C$ is set, a period of time until the junction temperature of the transistor $Q_1$ reaches Tj(t) of 125° C., for example, is determined, and the current $I_C$ is maintained for the determined period of time.

In the above description, the transistor $Q_1$ has been determined with respect to its quality. However, it can readily be understood that any of the other transistors $Q_2$ through $Q_6$ can also be determined while being connected in the inverter circuit 12. To inspect any of these transistors $Q_2$ through $Q_6$, the common junction between the current detector 18 and the voltage detector 16 is connected to the collector of the transistor to be inspected, a current from the DC power supply 14 is supplied to the collector of the transistor to be inspected, a collector-to-emitter voltage $V_{CE}$ of the transistor to be inspected is measured, and a voltage according to a drive signal is applied to the base of the transistor to be inspected to operate only the transistor to be inspected.

The heating period in which the collector current is maintained at the value $I_C$ is about one second if the current value $I_C$ is 400 A. Therefore, the current $I_C$ and the voltage $V_{CE}$ should preferably be detected by simultaneous observation on a two-channel oscillograph or a two-channel digitizer rather than the current detector 18 and the voltage detector 16.

As described above, inasmuch as the transistors $Q_1$ through $Q_6$ can be inspected for their quality while they are being connected in the inverter circuit 12, the time and the number of steps required to check the transistors $Q_1$ through $Q_6$ are relatively small because it is not necessary to disconnect the transistors $Q_1$ through $Q_6$ from the inverter circuit 12 and connect them again back in the inverter circuit 12.

Quality determination of diodes $D_1$ through $D_6$ that are coupled in inverse parallel connection between the collector and emitter of the respective transistors $Q_1$ through $Q_6$ will be described below with reference to FIGS. 17 and 18.

Figure 17:
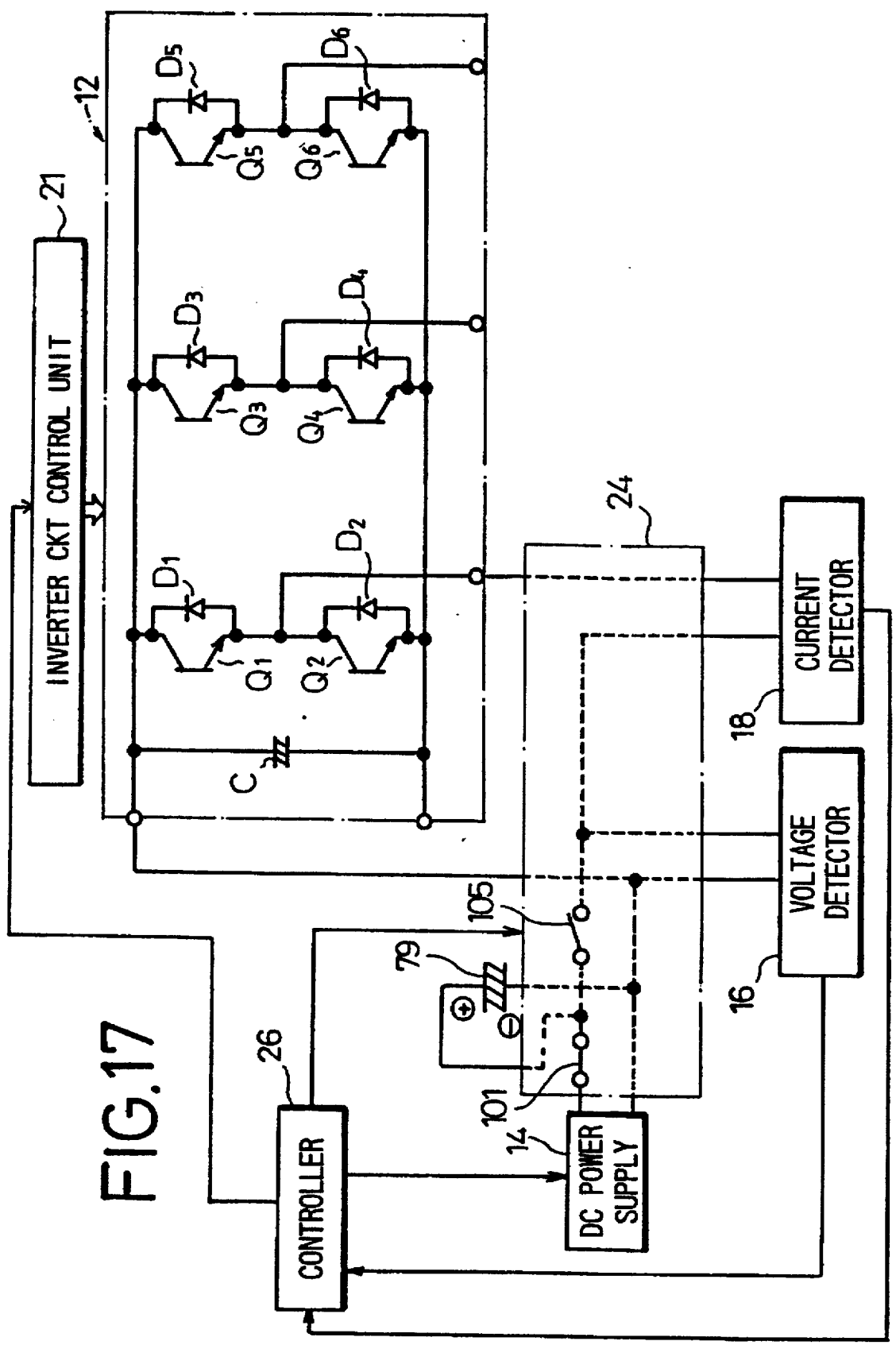
FIG. 17 is a block diagram of a inspecting arrangement in which the apparatus shown in FIG. 1 is employed to determine whether a diode is acceptable or not.

FIG. 17 shows in block form a inspecting arrangement in which the apparatus shown in FIG. 1 is employed to determine whether a diode is acceptable or not, and FIG. 18 shows an operation sequence of the inspecting arrangement shown in FIG. 17 to determine whether the diode is acceptable or not.

In FIG. 17, a switching circuit 24 has the same switching contacts as those of FIG. 4, and hence those switching contacts are omitted from illustration. A DC power supply 14, a voltage detector 16, a current detector 18, and a controller 26 are identical to those shown in FIG. 2.

The CPU 32 outputs a switching signal through the I/F 42 to the switching circuit 24, and the switching contacts of the switching circuit 24 are operated in response to the switching signal in a step S41. When the switching contacts of the switching circuit 24 are operated, an electrolytic capacitor 79 is connected across the DC power supply 14, the voltage detector 16 is connected between the collector and emitter of the transistor $Q_1$, and the current detector 18 is connected to detect a forward current $I_f$ of the diode $D_1$.

The inverter circuit control unit 21 receiving the output signal from the controller 26 now outputs a de-energization signal to the transistors $Q_1$ through $Q_6$, thereby rendering non-conductive the transistors $Q_1$ through $Q_6$ between their collector and emitter. The CPU 32 applies an energization start signal to the DC power supply 14. The switching contact 101 is closed and the switching contact 105 is opened. In response to the energization start signal, the DC power supply 14 supplies a charging current to charge the electrolytic capacitor 79 in a step S42.

Thereafter, the CPU 32 outputs a switching signal to open the switching contact 101 and close the switching contact 105. The electrolytic capacitor 79 is now discharged through the diode $D_1$ in a step S43.

A voltage $E_f$ developed across the diode $D_1$ while the electrolytic capacitor 79 is being discharged is detected by the voltage detector 16, and converted by the A/D converter 44 into a digital signal which is outputted to the diode determining circuit 54 in a step S44. The forward current $I_f$ flowing through the diode $D_1$ while the electrolytic capacitor 79 is being discharged is detected by the current detector 18, and converted by the A/D converter 46 into a digital signal which is also outputted to the diode determining circuit 54 in the step S44.

The diode determining circuit 54 determines whether the forward current $I_f$ at the voltage $E_f$ falls within a preset range stored in the diode determining circuit 54 in a step S45. The result of determination is outputted to the CPU 32. If the forward current $I_f$ falls in the preset range, then the CPU 32 outputs a signal to control the display unit 28 to display information indicating that the diode $D_1$ is acceptable in a step S46. If the forward current $I_f$ does not fall within the preset range, then the CPU 32 outputs a signal to control the display unit 28 to display information indicating that the diode $D_1$ is rejected in a step S47.

The steps S41 through S47 are repeated until all the diodes $D_1$ through $D_6$ are determined in a step S48.

According to the present invention, as described above, the switching circuit 24 has a matrix of switching contacts, which are operable by a switching signal from the controller 26 to establish a desired electric circuit for successively determining the quality of the electrolytic capacitor C, the transistors $Q_1$ through $Q_6$, the diodes $D_1$ through D6 which are connected in the inverter circuit 12 that is unitized.

Since the electrolytic capacitor C or the electrolytic capacitor 49 charged by the DC power supply 14 is used as a DC supply source, a maximum output current from the DC power supply 14 may be reduced, and hence the DC power supply 14 may be of a small size.

The apparatus for inspecting an electric component in an inverter circuit according to the present invention can inspect an electric component within a reduced time because the electric component remains connected in the inverter circuit, but is not disconnected from the inverter circuit, when it is inspected.

Although certain preferred embodiments of the present invention has been shown and described in detail, it should be understood that various changes and modifications may be made therein without departing from the scope of the appended claims.

What is claimed is:

1. A method of inspecting a transistor in an inverter circuit, while the transistor is being connected in the inverter circuit, comprising the steps of:

turning on only the transistor to be inspected which is being connected in the inverter circuit;

supplying a predetermined collector current to the transistor from a power supply until a junction temperature of the transistor reaches a predetermined temperature; and determining the transistor as being acceptable if a difference between a collector-to-emitter voltage of the transistor when the predetermined collector current is supplied from said power supply to the transistor and a collector-to-emitter voltage of the transistor when the junction temperature of the transistor reaches the predetermined temperature falls within a preset range.

2. An apparatus for inspecting transistors in an inverter circuit, while the transistors are connected in the inverter circuit, comprising:

a dc power supply for supplying a predetermined current;

voltage detection means for detecting collector-to-emitter voltages of the transistors;

switching means for coupling said dc power supply and said voltage detection means to the inverter circuit to supply the predetermined current as collector currents to the transistors and to detect the collector-to-emitter voltages of the transistors, respectively; and control means, coupled to the inverter circuit, said voltage detection means and said switching means, for turning on a selected one of the transistors, controlling said switching means to drive the selected transistor with the predetermined current and to couple said voltage detection means to the selected transistor to detect a first collector-to-emitter voltage of the selected transistor when the predetermined current flows through the selected transistor, determining when a junction temperature of the selected transistor reaches a predetermined temperature, determining a second collector-to-emitter voltage of the selected transistor as detected by said voltage detection means when the predetermined temperature is reached and determining that the selected transistor is acceptable if the first and second collector-to-emitter voltages are within a predetermined range.

3. The apparatus for inspecting transistors of claim 2, wherein said control means turns on each of the transistors in turn and controls said switching means to correspondingly drive the selected transistors with the predetermined current and to couple said voltage detection means to the selected transistors to inspect each of the transistors.

4. The apparatus for inspecting transistors of claim 2, wherein said control means controls said switching means to cut off supply of the predetermined current to the selected transistor once the predetermined temperature is reached.

5. The apparatus for inspecting transistors of claim 2, further comprising current detection means, coupled to the selected transistor by said switching means under control of said control means, for detecting a collector current of the selected transistor, said control means determining the first collector-to-emitter voltage when said current detection means detects that the collector current of the selected transistor equals the predetermined current.

6. The apparatus for inspecting transistors of claim 2, wherein said control means determines that the selected transistor is acceptable if a difference between the first and second collector-to-emitter voltages are within the predetermined range.

7. A method of inspecting transistors in an inverter circuit, while the transistors are connected in the inverter circuit, comprising the steps of:

a) turning on a selected one of the transistors of the inverter circuit;

b) coupling a predetermined current to the selected transistor;

c) detecting a first collector-to-emitter voltage of the selected transistor when the predetermined current flows through the selected transistor;

d) determining when a junction temperature of the selected transistor reaches a predetermined temperature;

e) detecting a second collector-to-emitter voltage of the selected transistor when the predetermined temperature is reached; and f) determining that the selected transistor is acceptable if the first and second collector-to-emitter voltages are within a predetermined range.

8. The method of inspecting transistors of claim 7, further comprising the step of:

g) turning on each of the transistors in turn and thereafter coupling the predetermined current to the corresponding transistors and detecting respective first and second collector-to-emitter voltages of the corresponding transistors in turn to inspect each of the transistors.

9. The method of inspecting transistors of claim 7, wherein said step e) comprises cutting off supply of the predetermined current to the selected transistor once the predetermined temperature is reached.

10. The method of inspecting transistors of claim 7, wherein said step f) comprises determining that the selected transistor is acceptable if a difference between the first and second collector-to-emitter voltages are within the predetermined range.

* * * * *